(12) United States Patent
Hara et al.

(10) Patent No.: US 11,488,913 B2
(45) Date of Patent: Nov. 1, 2022

(54) SEMICONDUCTOR DEVICE WITH GUARD RING

(71) Applicant: Socionext Inc., Kanagawa (JP)

(72) Inventors: Akio Hara, Kanagawa (JP); Toyoji Sawada, Kanagawa (JP); Masaki Okuno, Kanagawa (JP); Hirosato Ochimizu, Kanagawa (JP)

(73) Assignee: Socionext Inc., Kanagawa (JP)

( * ) Notice: Subject to any disclaimer, the term of this patent is extended or adjusted under 35 U.S.C. 154(b) by 21 days.

(21) Appl. No.: 17/036,409

(22) Filed: Sep. 29, 2020

(65) Prior Publication Data

US 2021/0028129 A1 Jan. 28, 2021

Related U.S. Application Data

(63) Continuation of application No. PCT/JP2019/008591, filed on Mar. 5, 2019.
(Continued)

(51) Int. Cl.
*H01L 23/58* (2006.01)
*H01L 23/522* (2006.01)

(52) U.S. Cl.
CPC ........ *H01L 23/585* (2013.01); *H01L 23/5226* (2013.01)

(58) Field of Classification Search
CPC ... H01L 23/585; H01L 23/5226; H01L 24/05; H01L 24/13; H01L 2224/02166;
(Continued)

(56) References Cited

U.S. PATENT DOCUMENTS 9,589,912 B1 3/2017 Liang et al.
2004/0084777 A1* 5/2004 Yamanoue ............ H01L 23/585
257/E21.244
(Continued)

FOREIGN PATENT DOCUMENTS

CN 101197372 B * 9/2010 ....... H01L 21/76801
JP 2005-167198 6/2005
(Continued)

OTHER PUBLICATIONS

A. Gupta et al., "Integration scheme and 3D RC extractions of three-level supervia at 16 nm half-pitch", Microelectronic Engineering, vol. 191, May 5, 2018, pp. 20-24 (Available online Jan. 31, 2018).
(Continued)

*Primary Examiner* — Douglas W Owens
(74) *Attorney, Agent, or Firm* — IPUSA, PLLC

(57) ABSTRACT

A semiconductor device includes a substrate having a circuit region and a peripheral region disposed around and enclosing the circuit region in a plan view, a first interconnect layer formed on the substrate, a second interconnect layer formed on the first interconnect layer, a third interconnect layer formed on the second interconnect layer, and a guard ring formed in the peripheral region, wherein the guard ring includes a first interconnect formed in the first interconnect layer, and disposed around and enclosing the circuit region in a plan view, a second interconnect formed in the third interconnect layer, and disposed around and enclosing the circuit region in a plan view, and a first via connected to the first interconnect and to the second interconnect, and disposed in a groove shape along a perimeter edge of the substrate in a plan view.

12 Claims, 32 Drawing Sheets

Related U.S. Application Data

(60) Provisional application No. 62/651,289, filed on Apr. 2, 2018.

(58) Field of Classification Search
CPC . H01L 2224/05559; H01L 2224/05572; H01L 2224/11; H01L 2224/13101; H01L 2224/13144; H01L 2224/13147; H01L 2924/00014
See application file for complete search history.

(56) References Cited

U.S. PATENT DOCUMENTS

| | | |
|---|---|---|
| 2004/0238950 A1 | 12/2004 | Doan |
| 2005/0098893 A1 | 5/2005 | Tsutsue et al. |
| 2008/0067690 A1 | 3/2008 | Kumagai |
| 2008/0230874 A1 | 9/2008 | Yamada et al. |
| 2009/0096104 A1 | 4/2009 | Lee et al. |
| 2013/0001787 A1* | 1/2013 | Yoshizawa ............ H01L 23/585 257/762 |
| 2014/0110789 A1* | 4/2014 | Koketsu ................. H01L 24/81 257/368 |
| 2017/0179378 A1 | 6/2017 | Kar et al. |
| 2017/0358586 A1 | 12/2017 | Huynh Bao et al. |

FOREIGN PATENT DOCUMENTS

| | | |
|---|---|---|
| JP | 2006-114723 | 4/2006 |
| JP | 2008-098605 | 4/2008 |
| JP | 2008-270232 | 11/2008 |
| JP | 2008-270720 | 11/2008 |
| JP | 2013-016540 | 1/2013 |

OTHER PUBLICATIONS

International Search Report dated Jun. 11, 2019 with respect to No. PCT/JP2019/008591.

Written Opinion of The International Searching Authority dated Jun. 11, 2019 with respect to No. PCT/JP2019/008591, with English translation of the relevant part.

* cited by examiner

SEMICONDUCTOR DEVICE WITH GUARD RING

CROSS-REFERENCE TO RELATED APPLICATIONS

This application is a continuation of International Application PCT/JP2019/008591, filed on Mar. 5, 2019 and designated the U.S., which claims the benefit of U.S. Provisional Application No. 62/651,289, filed on Apr. 2, 2018. The entire contents of these applications are incorporated herein by reference.

BACKGROUND OF THE INVENTION

1. Field of the Invention

The disclosures herein relate to a semiconductor device.

2. Description of the Related Art

During the manufacturing process of semiconductor devices, semiconductor devices are separated from a wafer by a variety of methods such as dicing the wafer using a blade or the like. An impact exerted during the dicing process may create a crack in insulating films or the like in a semiconductor device. In consideration of this, a peripheral structure (which may be referred to as a die seal or a seal ring) such as a ring-shaped interconnect or a via-based guard ring may be provided along the perimeter of a semiconductor device in order to reduce the likelihood of crack propagation.

Interconnects form part of the peripheral structure such as a guard ring, and there is an interface between the upper surface of the interconnects and an insulating film or via situated on the interconnects. A crack generated by a dicing process or the like may propagate along the interface. When the crack reaches a circuit region situated inside the peripheral structure, interconnects or the like may be broken or the characteristics or reliability of the semiconductor device may be deteriorated.

[Patent Document 1] U.S. Pat. No. 9,589,912
[Patent Document 2] U.S. Patent Publication No. 2017/0179378
[Patent Document 3] U.S. Patent Publication No. 2017/0358586
[Patent Document 4] U.S. Patent Publication No. 2004/0238950
[Patent Document 5] Japanese Patent Application Publication No. 2008-270720
[Patent Document 6] Japanese Patent Application Publication No. 2013-016540
[Non-Patent Document 1] "Integration scheme and 3D RC extractions of three-level supervia at 16 nm half-pitch", Microelectronic Engineering, Volume 191, 5 May 2018, Pages 20-24 (Available online 31 Jan. 2018)

SUMMARY OF THE INVENTION

According to an embodiment, a semiconductor device includes a substrate having a circuit region and a peripheral region disposed around and enclosing the circuit region in a plan view, a first interconnect layer formed on the substrate, a second interconnect layer formed on the first interconnect layer, a third interconnect layer formed on the second interconnect layer, and a guard ring formed in the peripheral region, wherein the guard ring includes a first interconnect formed in the first interconnect layer, and disposed around and enclosing the circuit region in a plan view, a second interconnect formed in the third interconnect layer, and disposed around and enclosing the circuit region in a plan view, and a first via connected to the first interconnect and to the second interconnect, and disposed in a groove shape along a perimeter edge of the substrate in a plan view.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

According to the technology of the present disclosures, an interconnect in one layer and an interconnect in the layer located two or more layers above the noted layer are directly connected by an interlayer connection via that is not connected to any of the intervening layer(s), and such an interlayer connection via is used to form a peripheral structure such as a guard ring. For example, an interlayer connection via connects the first interconnect layer (M1 layer) and the third interconnect layer (M3 layer), which is located two layers above the noted layer, but is not connected to the second interconnect layer (M2 layer), which is on the M1 layer and beneath the M3 layer. An interlayer connection via is arranged such as to have a groove shape in a plan view, for example. In this case, the part of a peripheral structure that has the interlayer connection via does not have an interface between the M2 layer interconnections and an interlayer insulating film or a via situated on the M2 layer interconnections. The likelihood of crack propagation at an interface is thus reduced.

First Embodiment

Figure 1A:
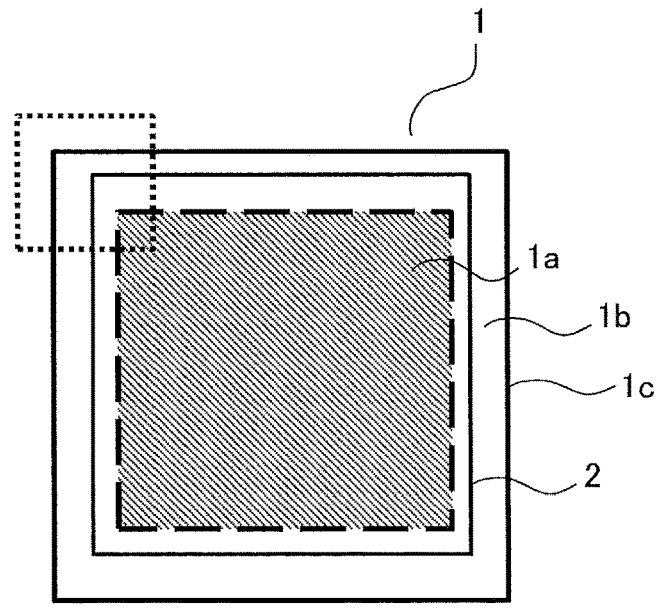
FIG. 1A is a drawing illustrating a first embodiment.

FIGS. 1A through 10 illustrate a first embodiment. FIG. 1A is a drawing illustrating a schematic configuration of a semiconductor device 1. The semiconductor device 1 is rectangular in a plan view with four corners, for example. As illustrated in FIG. 1A, the semiconductor device 1 includes a circuit region 1a having various circuits disposed therein and a peripheral region 1b located around the circuit region 1a. The peripheral region 1b is disposed around and encloses the circuit region 1a in a plan view. In the first embodiment, the peripheral region 1b includes a guard ring 2 that is disposed around and encloses the circuit region 1a in a plan view. The guard ring 2 is disposed along the perimeter edge 1c of the semiconductor device 1 in a plan view, for example, as illustrated in FIG. 1A. In other words, the guard ring 2 is situated between the circuit region 1a and the perimeter edge 1c. In FIG. 1B, the configuration of interconnects or the like disposed in the circuit region 1a is omitted from the illustration.

Figure 1B:
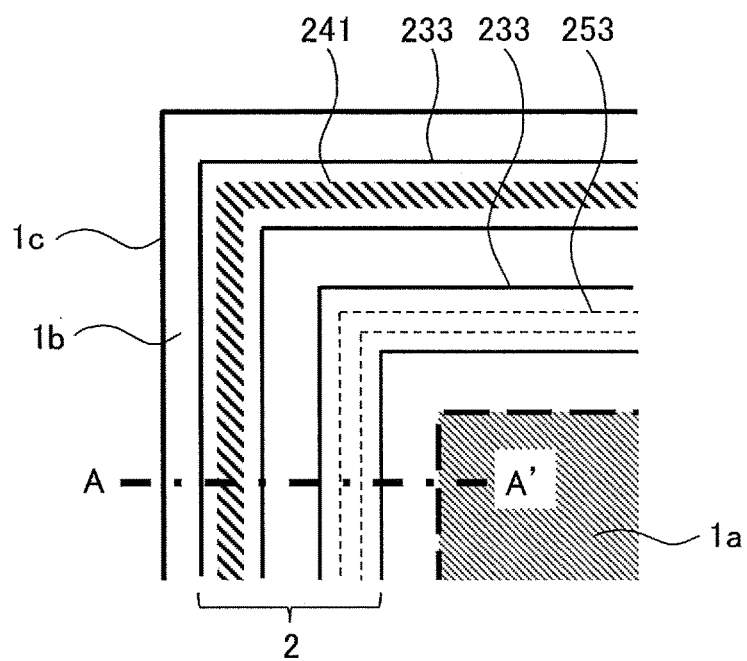
FIG. 1B is a drawing illustrating the first embodiment.

FIG. 1B is an enlarged plan view of the upper left corner (as illustrated by a dotted-line frame) illustrated in FIG. 1A. FIG. 1B illustrates, by way of example, the planar arrangement of interconnects 233 formed in the M3 layer and an interlayer connection via 241 and a via 253 situated thereunder. It may be noted that the configuration of interconnects or the like disposed in the circuit region 1a is omitted from the illustration.

The guard ring 2 of the present embodiment has an interlayer connection via arranged in a groove shape in a plan view. As illustrated in FIG. 1B, the guard ring 2 includes two interconnects 233 in the M3 layer. Each interconnect 233 is arranged around and encloses the circuit region 1a in a plan view. As illustrated in FIG. 1B, the guard ring 2 includes an interlayer connection via 241 situated under the one of the two interconnects 233 that is closer to the perimeter edge 1c (i.e., the outer one). The interlayer connection via 241 is arranged in a groove shape in a plan view, and encloses the circuit region 1a, for example. The guard ring 2 has a via 253 disposed under the one of the two interconnects 233 that is closer to the circuit region 1a (i.e., the inner one), as illustrated in FIG. 1B. The via 253 has a groove shape in a plan view, and encloses the circuit region 1a, for example.

Figure 1C:
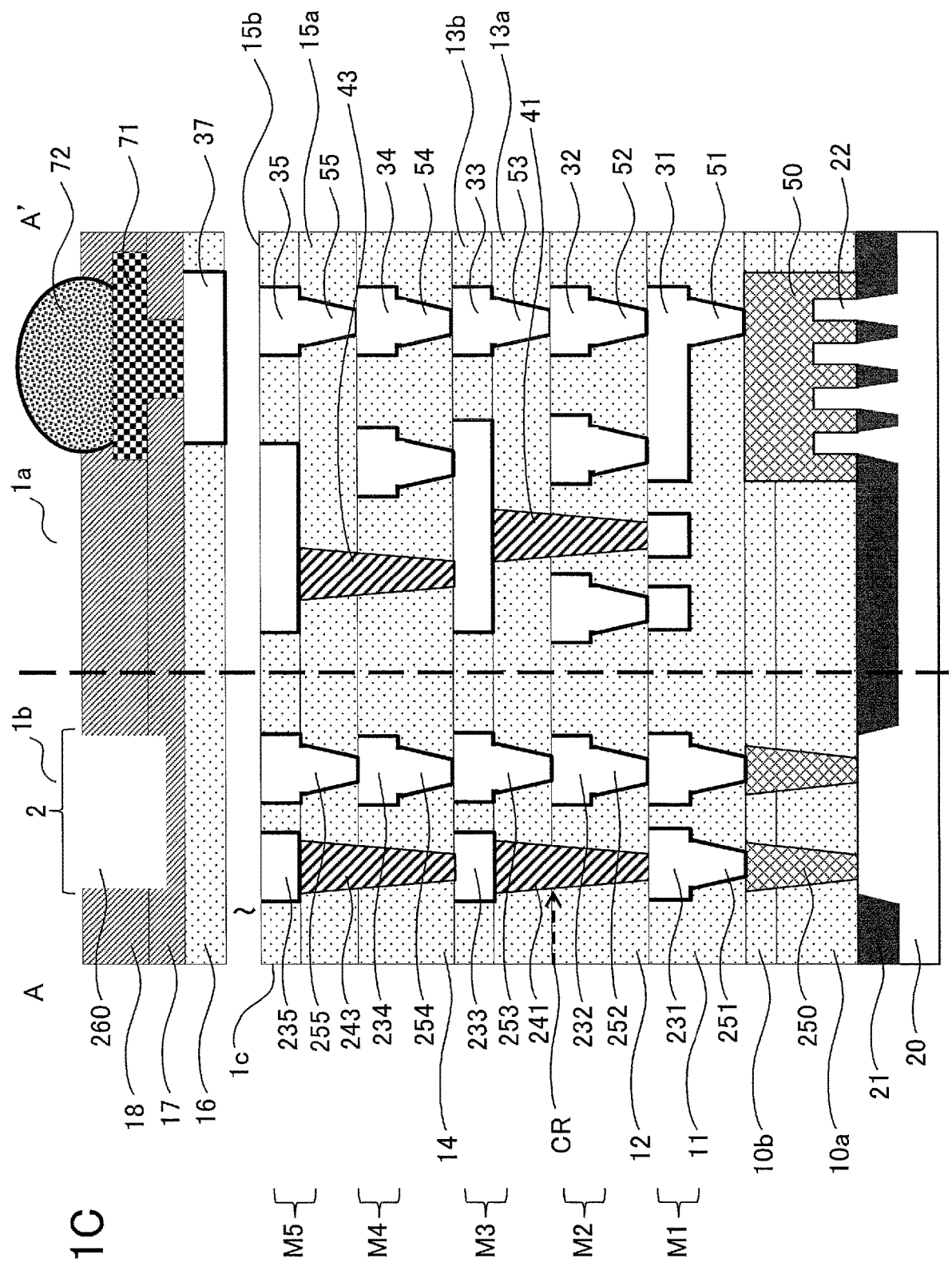
FIG. 1C is a drawing illustrating the first embodiment.

FIG. 1C is a cross-sectional view taken along the line A-A' in FIG. 1B. The guard ring 2 formed in the peripheral region 1b includes, for example, an M1 layer interconnect 231, an M2 layer interconnect 232, an M3 layer interconnect 233, an M4 layer interconnect 234, an M5 layer interconnect 235, a contact via 250 connected to a substrate 20, a via 251 connecting the contact via 250 and the interconnect 231, a via 252 connecting the interconnect 231 and the interconnect 232, a via 253 connecting the interconnect 232 and the interconnect 233, a via 254 connecting the interconnect 233 and the interconnect 234, a via 255 connecting the interconnect 234 and the interconnect 235, an interlayer connection via 241 connecting the interconnect 231 and the interconnect 233, and an interlayer connection via 243 connecting the interconnect 233 and the interconnect 235. An STI (shallow trench isolation) 21 is formed on the upper surface of the substrate 20. In the peripheral region 1b, the substrate 20 may have a fin structure similarly to the circuit region 1a. A contact via 250 may be connected to the fin structure (the same may also apply in other embodiments). The interlayer connection via 243 may also be disposed around and enclose the circuit region 1a in a plan view, similarly to the interlayer connection via 241. The guard ring 2 further includes an opening 260 formed in the upper-layer insulating films 17 and 18, for example. The opening 260 may be arranged around and enclose the circuit region in a plan view, or may be arranged only in a portion of the peripheral region. Alternatively, the formation of the opening 260 may be omitted.

Further, the circuit region 1a has formed therein an M1 layer interconnect 31, an M2 layer interconnect 32, an M3 layer interconnect 33, an M4 layer interconnect 34, an M5 layer interconnect 35, a contact via 50 connected to the fins 22 of fin-type transistors formed in the substrate 20, a via 51 connecting the contact via 50 and the interconnect 31, a via 52 connecting the interconnect 31 and the interconnect 32, a via 53 connecting the interconnect 32 and the interconnect 33, a via 54 connecting the interconnect 33 and the interconnect 34, a via 55 connecting the interconnect 34 and the interconnect 35, an interlayer connection via 41 connecting the interconnect 31 and the interconnect 33, and an interlayer connection via 43 connecting the interconnect 33 and the interconnect 35, for example. The circuit region 1a further has formed therein an interconnect 37, a pad 71 on the interconnect 37, and a solder bump 72 on the pad 71. Alternatively, the pad 71 may have formed thereon, rather than the solder bump 72, a stud bump made of a material such as gold, a Cu pillar made of a material such as copper, one end of a bonding wire connected to an outside of the semiconductor device 1, or the like.

The guard ring 2 of the first embodiment uses an interlayer connection via (e.g., 241). In this configuration, the place where the interlayer connection via 241 is disposed has no interface between the upper surface of the M2 layer interconnect and an interlayer insulating film situated thereon, while such an interface could be a path through which a crack CR may propagate. As a result, the interlayer connection via 241 serves to stop the propagation of the crack CR in the vicinity of the M2 layer. It is thus possible to reduce the likelihood of a propagating crack reaching the circuit region.

In the first embodiment, the M3 layer interconnect 233 and the interlayer connection via 241 situated therebeneath are referred to for the purpose of describing the technology of the present disclosures. Notwithstanding this, the guard ring 2 may be formed using interconnects and an interlayer connection via formed in other layers. Further, as illustrated in FIGS. 1B and 1C, the guard ring is configured such that two interconnects are arranged alongside each other in a plan view. Notwithstanding this, only one interconnect that has an interlayer connection via connected thereto may be arranged in a plan view.

The guard ring 2 may be such that the interconnects 231, 232, 234, and 235 as well as the contact vias 250, 251, 252, 253, 254, and 255 are arranged around and enclose the circuit region 1a in a plan view, similarly to the interlayer connection vias 241 and 233 The materials of the contact vias 50 and 250 include tungsten, cobalt, ruthenium, for example. The contact vias 50 and 250 may also include a film made of titanium nitride or titanium as an underlying barrier metal film (not illustrated). In the case of the material of the contact vias 50 and 250 being cobalt or ruthenium, the formation of such an underlying barrier metal film may be omitted.

Although the interlayer connection vias 241 and 243 are provided in FIG. 1C. only one of these may be provided. Although five interconnect layers (i.e., M1 to M5 layers) are formed in the noted example, the number of interconnect layers may be more than five, or may be less than five.

Figure 2A:
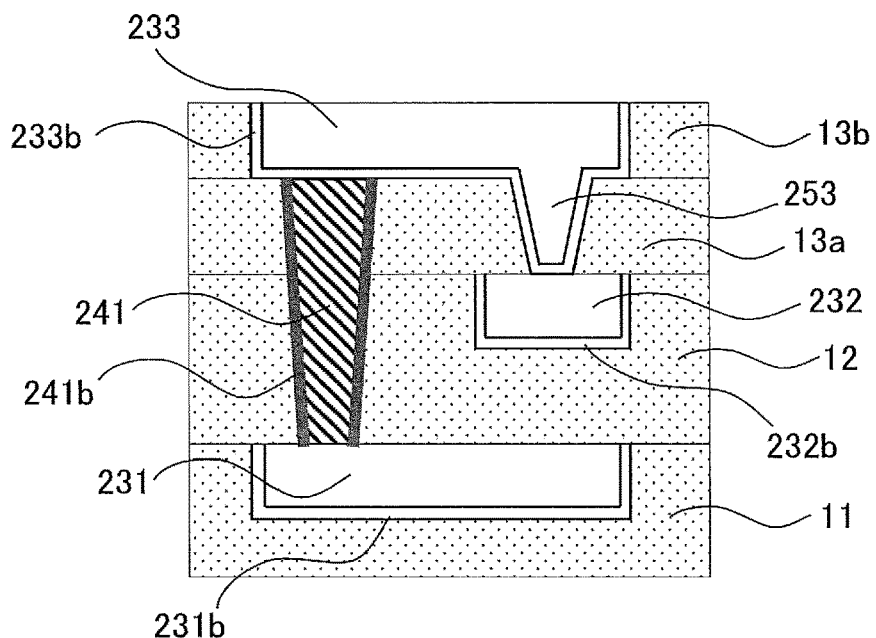
FIG. 2A is a drawing illustrating the detail of a cross-sectional structure of an interlayer connection via.
Figure 2B:
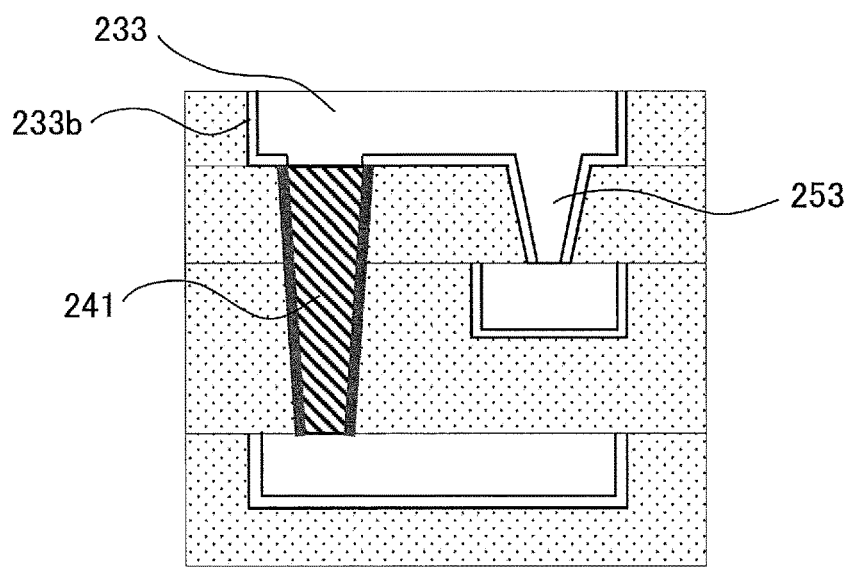
FIG. 2B is a drawing illustrating the detail of a cross-sectional structure of an interlayer connection via.
Figure 2C:
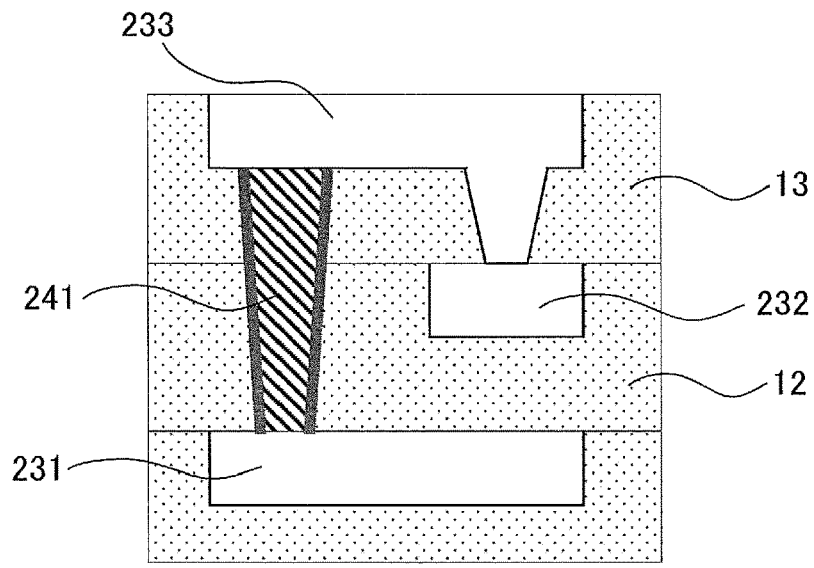
FIG. 2C is a drawing illustrating the detail of a cross-sectional structure of an interlayer connection via.

FIGS. 2A through 2C illustrate the detail of a cross-sectional structure of the interlayer connection via according to the present embodiment. It may be noted that FIGS. 2A through 2C illustrate the interlayer connection via 241 as an example, and other interlayer connection vias may have the same structure.

As illustrated in FIG. 2A, the interconnect 231 is formed in an interlayer insulating film 11. The interconnect 231 has an underlying barrier metal film 231b. An interlayer insulating film 12 is formed on the interconnect 231. The interconnect 232 is formed in the interlayer insulating film 12. The interconnect 232 has an underlying barrier metal film 232b. Interlayer insulating films 13a and 13b are formed on the interconnect 232. The via 253 is formed in the interlayer insulating film 13a. The interconnect 233 is formed in the interlayer insulating film 13b. The via 253 and the interconnect 233 have a dual damascene structure formed as one seamless piece. The via 253 and the interconnect 233 have an underlying barrier metal film 233b. The material of the interlayer insulating films 11, 12, 13a, and 13b is SiO, TEOS, PSG, BPSG, FSG, SiOC, SOG, SILK, a spin-on-polymer, a silicon carbon material, a combination thereof, or the like, for example. The material of the interconnects 231, 232, and 233 is copper, cobalt, ruthenium, or the like, for example. The material of the barrier metal films 231b, 232b, and 233b is tantalum, tantalum nitride, manganese ruthenium, cobalt-containing tantalum nitride, ruthenium, or the like, for example.

The interlayer connection via 241 is formed in the interlayer insulating films 12 and 13a. The interlayer connection via 241 includes copper, cobalt, ruthenium, for example. Although not illustrated, an interlayer connection via may have an underlying barrier metal film, similarly to the interconnect 231 or the like. A barrier insulating film 241b is formed on the side surface of the interlayer connection via 241. The barrier insulating film 241b may be a silicon oxide film (SiO), a silicon nitride film (SiN), a silicon carbonitride film (SiCN), a silicon carbide film (SiC), or the like, for example.

These materials for interconnects, interlayer connection vias, vias, and interlayer insulating films may also be applied to interconnects, interlayer connection vias, vias, and interlayer insulating films in other layers.

In the case of FIG. 2A, the interlayer connection via 241 is formed, and, then, the interlayer insulating film 13b is formed, followed by forming the interconnect 233 and the via 253. Because of this, the barrier metal film 233b for the interconnect 233 is inevitably formed on the interlayer connection via 241.

FIG. 2B illustrates an example of another cross-sectional structure of the present embodiment. The example illustrated in FIG. 2B differs in that no barrier metal film 233b is formed on at least a portion of the interlayer connection via 241. The barrier metal film 233b is formed in such a condition as to be selectively formed on an insulating film, for example.

In the configuration illustrated in FIG. 2B, the interlayer connection via 241 is connected to the interconnect 233 without an intervening barrier metal film 233b, which serves to reduce electrical resistance.

FIG. 2C is an example of another cross-sectional structure of the present embodiment. In the example illustrated in FIG. 2C, the interconnect 233 differs from that of the other examples in that no barrier metal film is provided. When the material of the interconnect 233 is cobalt or ruthenium, for example, the formation of a barrier metal film is omitted as is illustrated.

In the example illustrated in FIG. 2C, an upper portion of the interlayer connection via 241 and the interconnect 233 are formed in a single interlayer insulating film 13. In this example, the interlayer insulating film 13 is formed, and, then, a groove for forming the interlayer connection via 241 is formed in the interlayer insulating films 12 and 13. Subsequently, a groove for forming the interconnect 233 and a groove for forming the via 253 are formed in the interlayer insulating film 13. These grooves are then filled with a metal containing cobalt or ruthenium, thereby forming the interlayer connection via 241, the interconnect 233, and the via 252 as one seamless structure. The configuration in which an upper portion of an interlayer connection via and an interconnect situated on the interlayer connection via are formed in a single interlayer insulating film is not limited to FIG. 2C, and may as well be applied to the configuration illustrated in FIG. 2A or 2B.

The configuration of the interlayer connection via, the interconnects, and the interlayer insulating films illustrated in FIGS. 2A through 2C may be applied to variations of the first embodiment and to other embodiments.

In the following, first through sixth variations of the first embodiment will be described. Although all of the first through sixth variations will be described by using the interlayer connection via 241 and the interconnects 233 as an example, these variations may as well be applied to an interlayer connection via and interconnects in other layers. The configurations of the first through sixth variations may be combined with each other or with other embodiments.

First Variation of First Embodiment

Figure 3A:
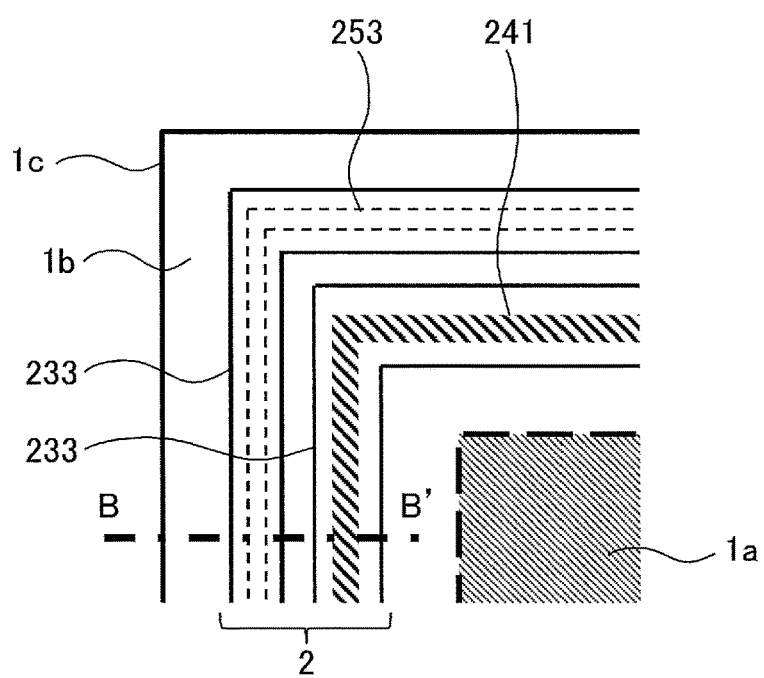
FIG. 3A is a drawing illustrating a first variation of the first embodiment.
Figure 3B:
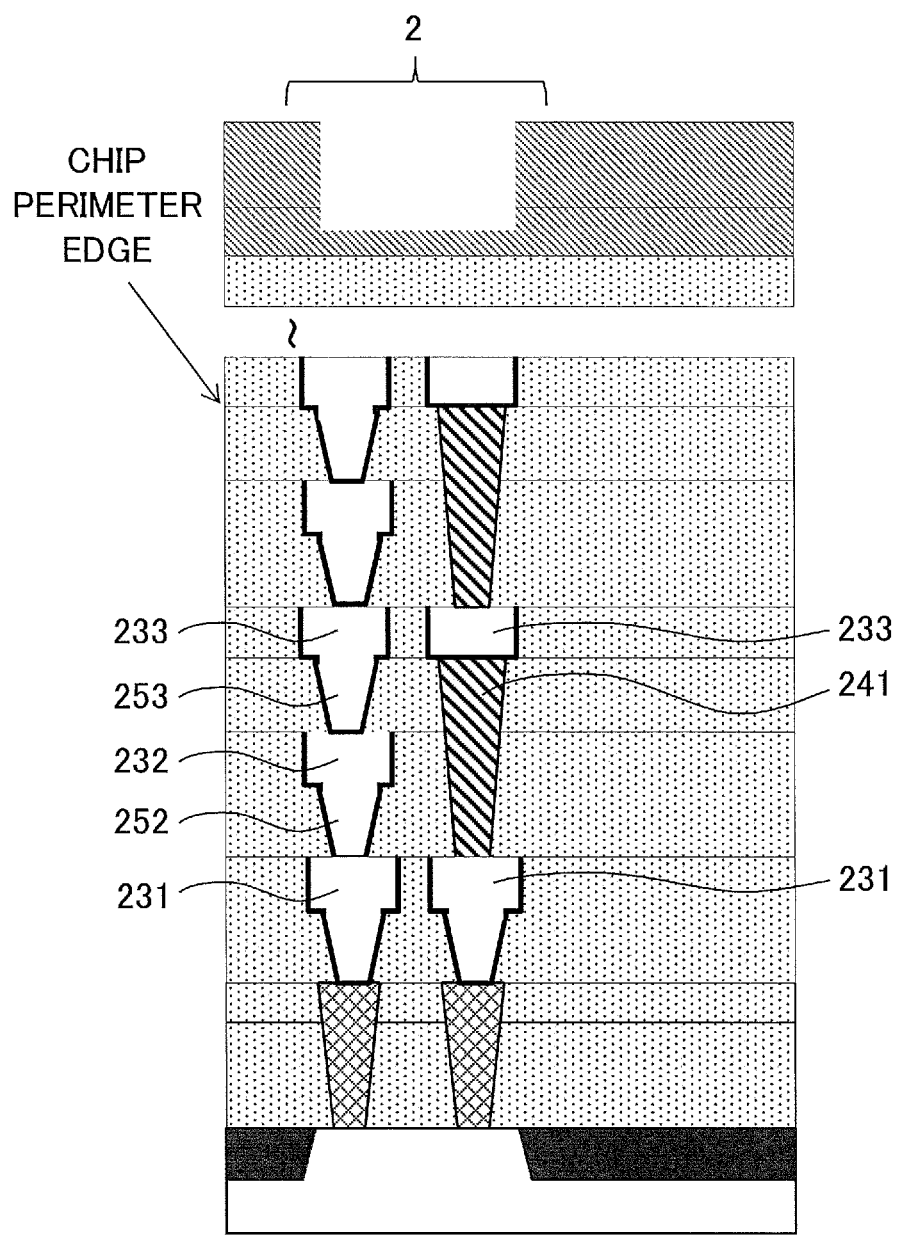
FIG. 3B is a drawing illustrating the first variation of the first embodiment.

FIGS. 3A and 3B illustrate a first variation of the first embodiment. In FIG. 3A, the configuration of interconnects and the like disposed in the circuit region 1a is omitted from the illustration. In the example illustrated in FIG. 1B, the groove-shape interlayer connection via 241 is disposed at an outer position, and the groove-shape via 253 is disposed at an inner position in a plan view. The first variation differs therefrom in that the groove-shape interlayer connection via 241 is disposed at an inner position, and the groove-shape via 253 is disposed at an outer position in a plan view. The guard ring 2 of FIG. 1B may be replaced with the configuration of the first variation.

Second Variation of First Embodiment

Figure 4A:
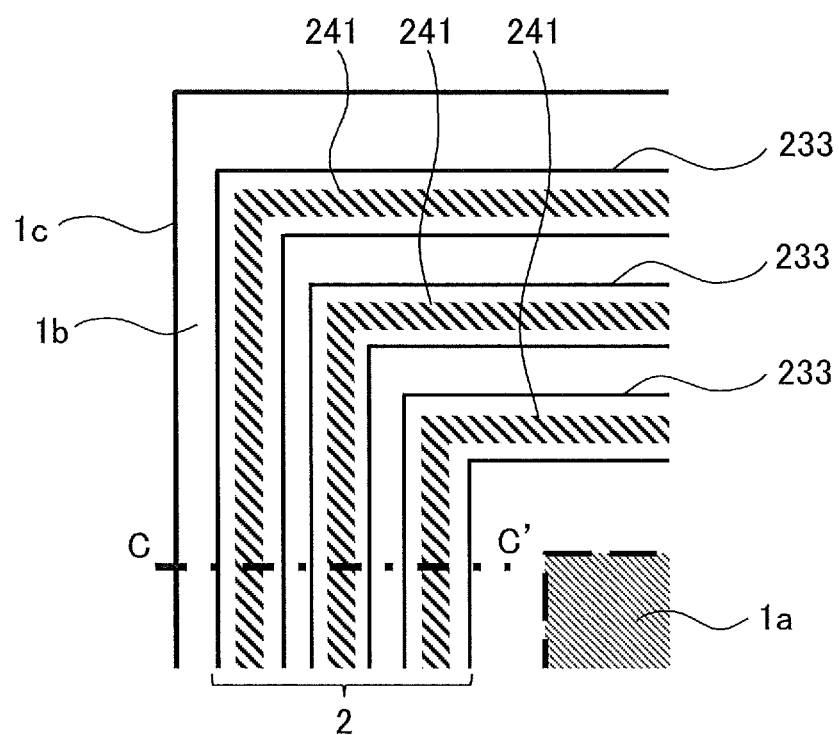
FIG. 4A is a drawing illustrating a second variation of the first embodiment.
Figure 4B:
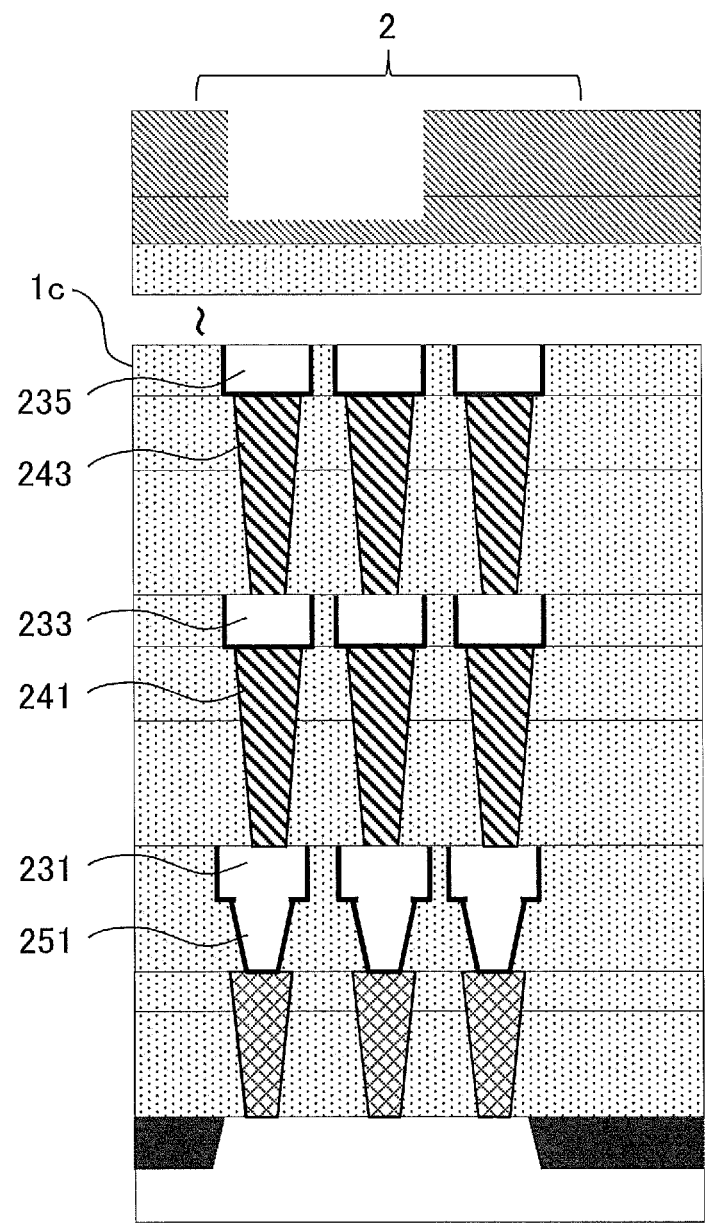
FIG. 4B is a drawing illustrating the second variation of the first embodiment.

FIGS. 4A and 4B illustrate a second variation of the first embodiment. In FIG. 4A, the configuration of interconnects and the like disposed in the circuit region 1a is omitted from the illustration. In the guard ring 2 of the second variation, a plurality of interlayer connection vias 241 are provided. The guard ring 2 of FIG. 1B may be replaced with the configuration of the second variation.

It may be noted that the number of interlayer connection vias 241 is not limited to three, and may alternatively be two or greater than or equal to four. Although not illustrated, the guard ring 2 may be such that groove-shape vias (e.g., via 253) for connecting an upper interconnect layer and a lower interconnect layer are provided around the circuit region 1a at an inner position or outer position relative to the plurality of interlayer connection vias.

Third Variation of First Embodiment

Figure 5A:
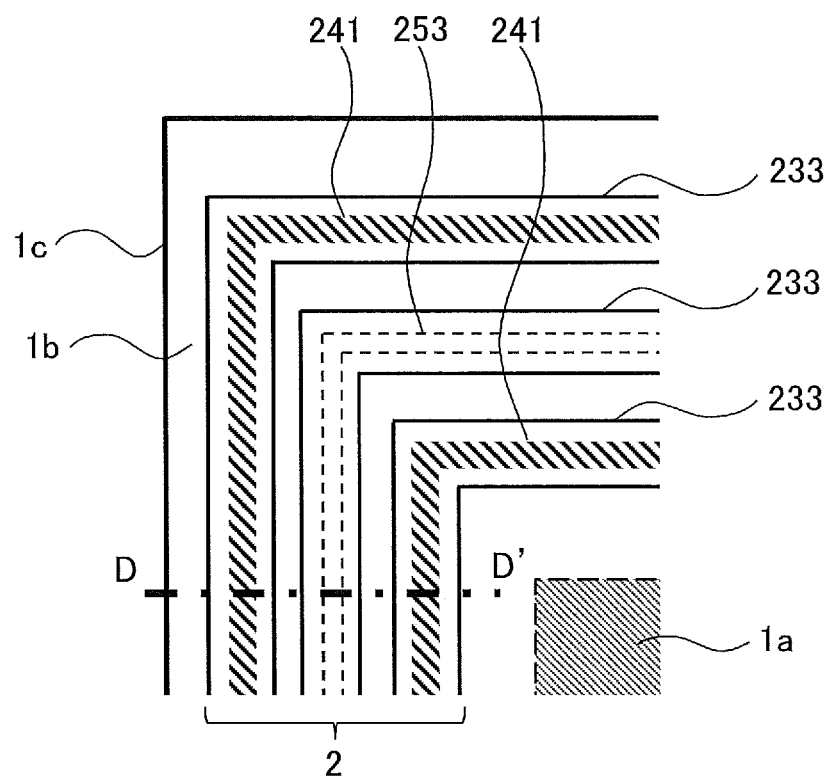
FIG. 5A is a drawing illustrating a third variation of the first embodiment.
Figure 5B:
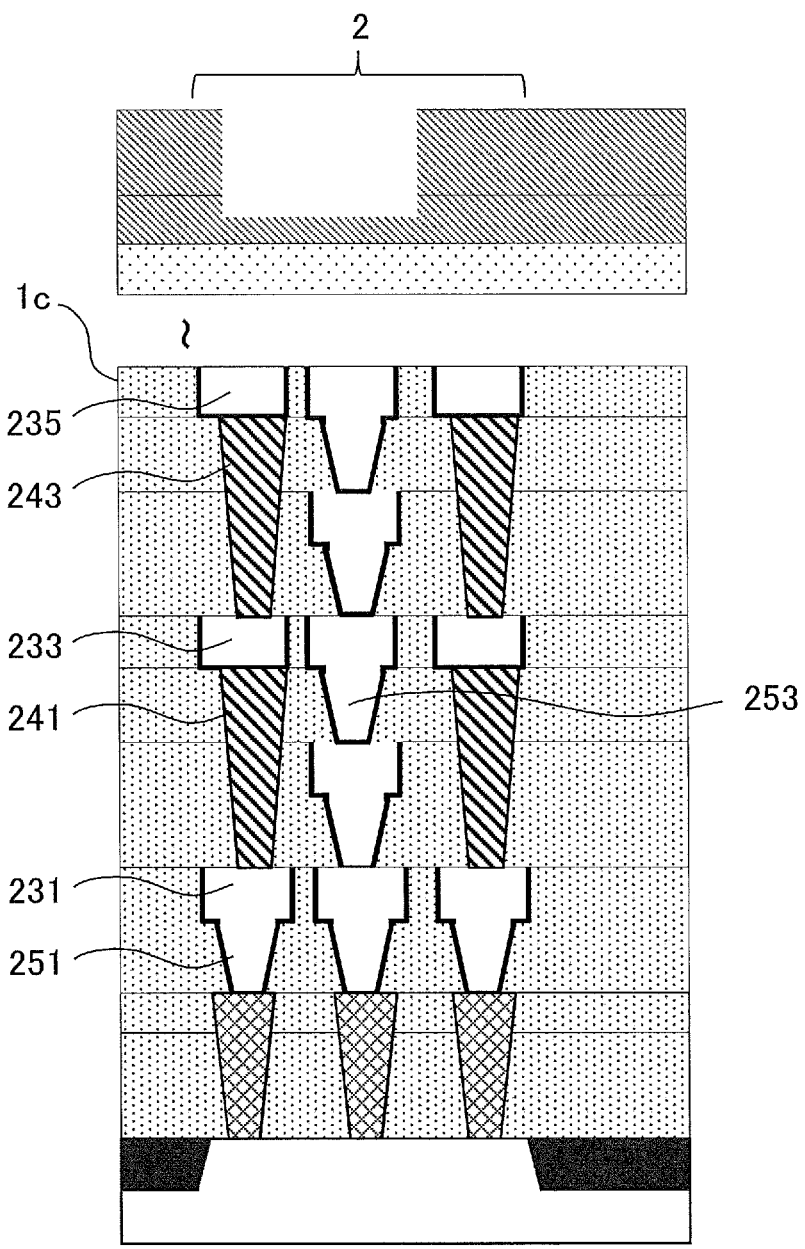
FIG. 5B is a drawing illustrating a third variation of the first embodiment.

FIGS. 5A and 5B illustrate a third variation of the first embodiment. In FIG. 5A, the configuration of interconnects and the like disposed in the circuit region 1a is omitted from the illustration. The guard ring 2 of the third variation is such that the groove-shape via 253 is positioned between the two interlayer connection vias 241 in a plan view. The guard ring 2 of FIG. 1B may be replaced with the configuration of the third variation. The number of interlayer connection vias 241 may alternatively be three or more. The interlayer connection vias 241 and the groove-shape vias 253 may be alternately arranged in a plan view.

Fourth Variation of First Embodiment

Figure 6:
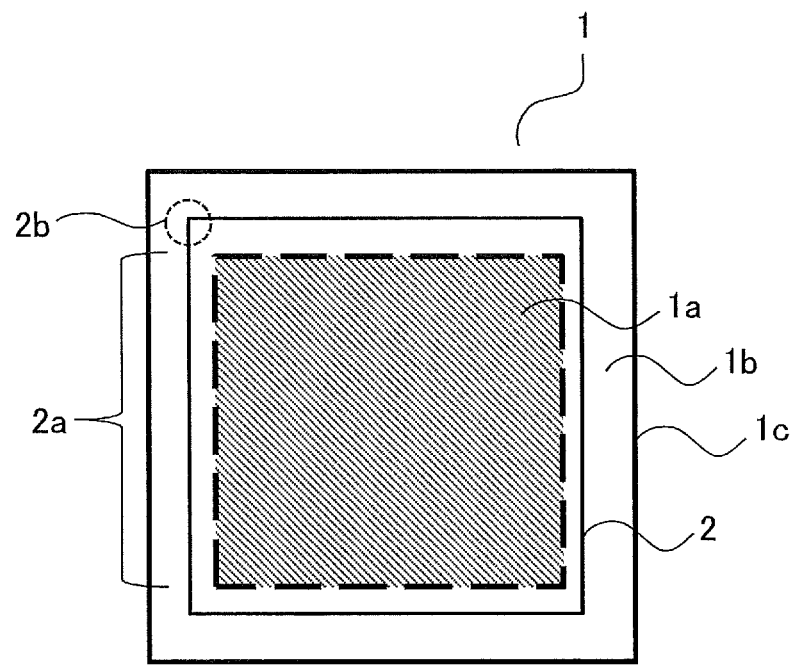
FIG. 6 is a drawing illustrating a fourth variation of the first embodiment.

A fourth variation of the first embodiment will be described with reference to FIG. 6 and FIGS. 7A through 7L. As illustrated in FIG. 6, the guard ring 2 includes bent portions 2b situated in the proximity of the four respective corners of the semiconductor device 1, and includes sides 2a each extending along the perimeter edge 1c between two of the bent portions 2b. In FIG. 6, the side 2a is illustrated only along the left edge of the semiconductor device 1. Nonetheless, the same configuration may be applied to the upper edge, the lower edge, and the right edge of the semiconductor device 1. The bent portion 2b is illustrated only at the upper left corner of the guard ring 2. Nonetheless, the lower left, lower right, and upper right corners may have substantially the same configuration.

FIGS. 7A through 7L are enlarged plan views of a portion of the side 2a of the guard ring 2 illustrated in FIG. 6. In connection with FIGS. 7A through 7L, the fourth variation will be described by using the interconnect 233, the interlayer connection via 241, and the like. It may be noted, however, that this is only an example, and the present variation may be applied to interconnects, interlayer connection vias, vias, contact vias, and the like formed in other layers.

Figure 7A:
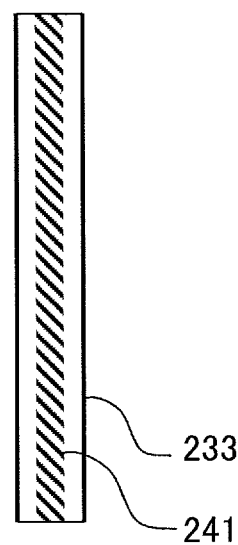
FIG. 7A is a drawing illustrating the fourth variation of the first embodiment.

As illustrated in FIG. 7A, the side 2a may be such that the interconnect 233 and the interlayer connection via 241 each have a straight-line shape in a plan view.

Figure 7B:
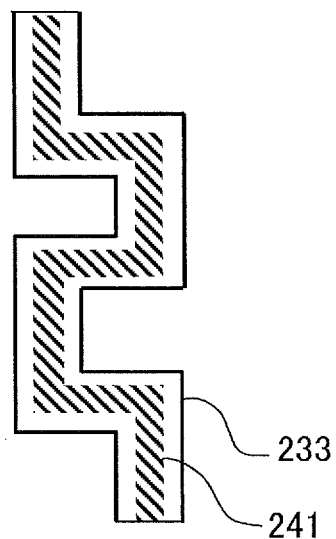
FIG. 7B is a drawing illustrating the fourth variation of the first embodiment.

As illustrated in FIG. 7B, the side 2a may be such that the interlayer connection via 241 and the interconnect 233 each have a meander shape in a plan view. In FIG. 7B, the interlayer connection via 241 and the interconnect 233 are bent such that an inside angle is 90 degrees in a plan view. The bending angle is not limited to this, and, also, bending angles may differ from each other, for example. Further, the interlayer connection via 241 and the interconnect 233 are each bent twice in the same direction and then bent twice in the opposite direction in a plan view, and such a configuration is repeated multiple times. Notwithstanding this, the number of consecutive bends in the same direction may be three or more, and the inside angle of such bends may be less than 90 degrees.

Figure 7C:
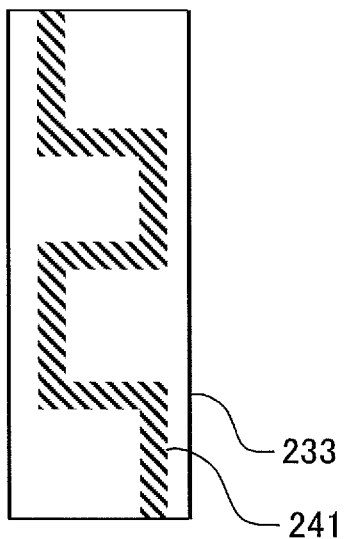
FIG. 7C is a drawing illustrating the fourth variation of the first embodiment.

As illustrated in FIG. 7C, the side 2a may be such that the interlayer connection via 241 has a meander shape in a plan view, and the interconnect 233 has a straight shape overlapping the interlayer connection via 241 in a plan view. In FIG. 7C, the interlayer connection via 241 is bent such that an inside angle is 90 degrees in a plan view. The bending angle is not limited to this, and, also, bending angles may differ from each other, for example. Further, the interlayer connection via 241 is bent twice in the same direction and then bent twice in the opposite direction in a plan view, and such a configuration is repeated multiple times. Notwithstanding this, the number of consecutive bends in the same direction may be three or more, and the inside angle of such bends may be less than 90 degrees.

Figure 7D:
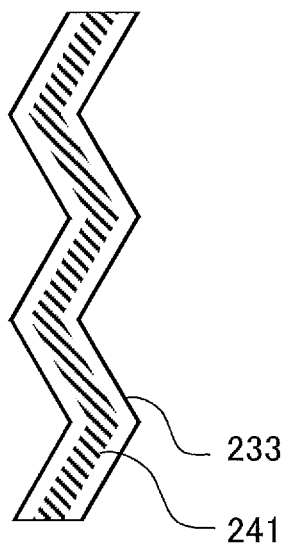
FIG. 7D is a drawing illustrating the fourth variation of the first embodiment.

As illustrated in FIG. 7D, the side 2a may be such that the interlayer connection via 241 and the interconnect 233 each have a zigzag shape in a plan view. In FIG. 7D, the interlayer connection via 241 and the interconnect 233 are each bent such that an inside angle is 120 degrees in a plan view. The bending angle may alternatively be greater than or less than 120 degrees. For example, the interlayer connection via 241 and the interconnect 233 may be bent at 90 degrees in a plan view.

Figure 7E:
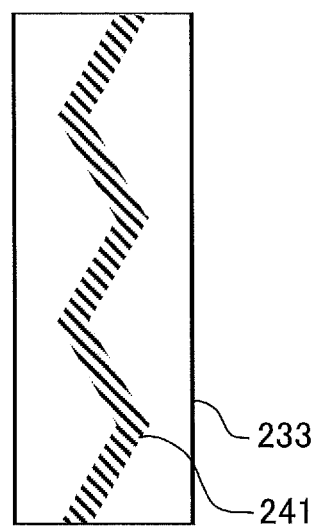
FIG. 7E is a drawing illustrating the fourth variation of the first embodiment.

As illustrated in FIG. 7E, the side 2a may be such that the interlayer connection via 241 has a zigzag shape in a plan view, and the interconnect 233 has a straight shape overlapping the interlayer connection via 241 in a plan view. In FIG. 7E, the interlayer connection via 241 is bent such that an inside angle is 120 degrees, but the bending angle may alternatively be greater than or less than 120 degrees. For example, the interlayer connection via 241 may be bent at 90 degrees in a plan view.

Figure 7F:
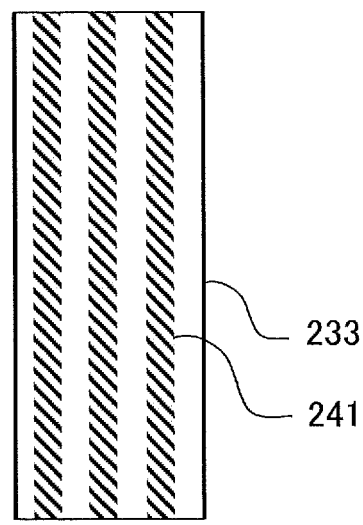
FIG. 7F is a drawing illustrating the fourth variation of the first embodiment.

As illustrated in FIG. 7F, the side 2a may be such that a plurality of interlayer connection vias 241 extending in groove shape are provided for a single interconnect 233. In this case, the number of interlayer connection vias 241 is not limited to three, and may alternatively be two or greater than or equal to four. The second variation of the first embodiment may be modified as illustrated in FIG. 7F.

Figure 7G:
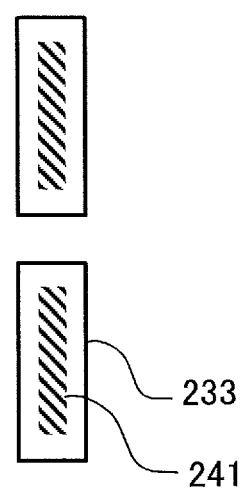
FIG. 7G is a drawing illustrating the fourth variation of the first embodiment.

As illustrated in FIG. 7G, the side 2a may be such that the interlayer connection via 241 and the interconnect 233 are discontinuously arranged in a plan view. The discontinuously disposed interlayer connection via 241 and interconnect 233 may be linearly arranged in a plan view.

Figure 7H:
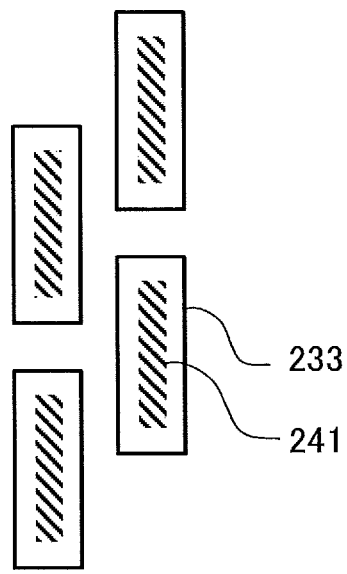
FIG. 7H is a drawing illustrating the fourth variation of the first embodiment.

As illustrated in FIG. 7H, the side 2a may be such that the discontinuously disposed interlayer connection vias 241 and interconnects 233 at the inner position and at the outer position may be arranged in a staggered manner in a plan view. The discontinuously disposed interlayer connection vias 241 and interconnects 233 may also be linearly arranged in a plan view both at the outer position and at the inner position.

Figure 7I:
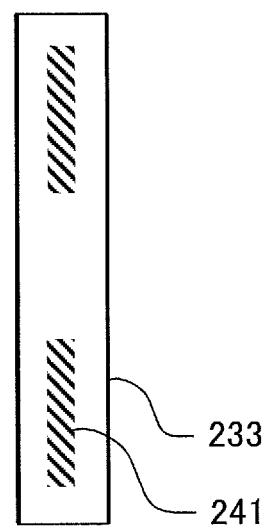
FIG. 7I is a drawing illustrating the fourth variation of the first embodiment.

As illustrated in FIG. 7I, the side 2a may be such that a plurality of interlayer connection vias 241 are discontinuously arranged in a plan view while the interconnect 233 is continuously arranged such as to overlap the discontinuous interlayer connection vias 241. The interconnect 233 may have a straight shape in a plan view, and the plurality of discontinuous interlayer connection vias 241 may be linearly arranged in a plan view.

Figure 7J:
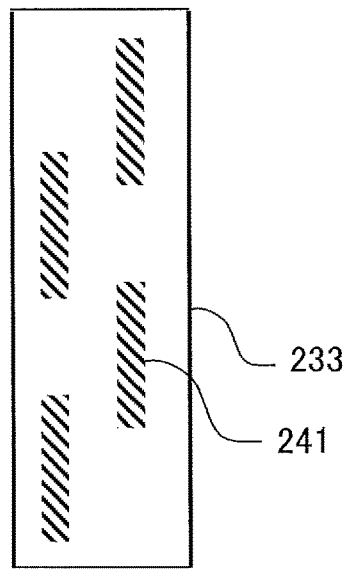
FIG. 7J is a drawing illustrating the fourth variation of the first embodiment.

As illustrated in FIG. 7J, the side 2a may be such that a plurality of discontinuous interlayer connection vias 241 at the inner position and at the outer position are arranged in a staggered manner while the interconnect 233 is continuous and overlaps the plurality of discontinuous interlayer connection vias 241. The discontinuously disposed interlayer connection vias 241 may also be linearly arranged in a plan view both at the inner position and at the outer position. The interconnect 233 may also have a straight shape.

Figure 7K:
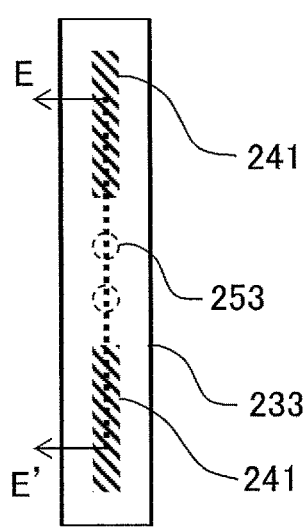
FIG. 7K is a drawing illustrating the fourth variation of the first embodiment.

As illustrated in FIG. 7K, the side 2a may be such that the two vias 253 are disposed between the discontinuous interlayer connection vias 241 in a plan view while the continuous interconnect 233 is arranged to overlap the interlayer connection vias 241 and the vias 253. The number of vias 253 is not limited to two, and may alternatively be one or greater than or equal to three.

Figure 7L:
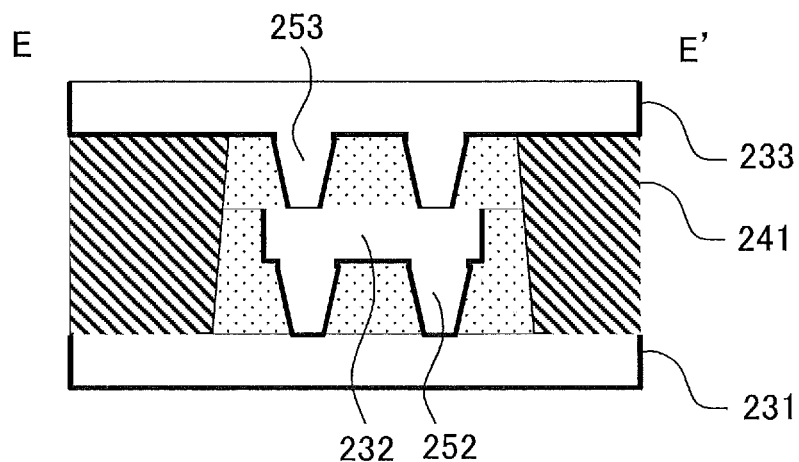
FIG. 7L is a drawing illustrating the fourth variation of the first embodiment.

FIG. 7L is a cross-sectional view taken along the line E-E' in FIG. 7K. The interlayer connection vias 241 are disposed on the interconnect 231. The interconnect 232 is disposed between the interconnect 231 and the interconnect 233. The vias 252 may also be disposed between the interconnect 231 and the interconnect 232.

Although not illustrated in FIGS. 7A through 7K, the interconnect 231 disposed beneath the interlayer connection via 241 in each modification may be arranged in the same configuration as the interconnect 233 in a plan view, or may be arranged in a different configuration.

Further, the modifications illustrated in FIGS. 7A through 7K may be combined with each other. For example, the crooked-line interlayer connection vias 241 illustrated in FIGS. 7B through 7E may be arranged discontinuously as in FIGS. 7G through 7K. Further, different kinds of modifications among the modifications illustrated in FIGS. 7A through 7K may be applied to one side 2a of the guard ring 2. The vias 253 of FIG. 7K may be applied to the modification illustrated in FIG. 7J. In each modification, a plurality of interlayer connection vias 241 may be disposed for one interconnect 233 as in the case of FIG. 7G. Further, in the case in which a plurality of interlayer connection vias 241 are arranged as in the second and third variations of the first embodiment, all the interlayer connection vias may be arranged in the same configuration corresponding to one of the modifications illustrated in FIG. 7A through 7K, or may be arranged in respective, different configurations.

Moreover, one or more combinations of the present modifications may be applied to the guard rings 2 of other embodiments (i.e., the second to fifth embodiments which will be described later). A moisture-resistant ring 3 of the fifth embodiment may also be one to which one or more combinations of the fourth variations is applied to.

In the case in which the modifications illustrated in FIGS. 7A through 7L are applied to a side of the guard ring 2 different from the left side thereof, each is rotated in a plan view such as to extend along the perimeter edge 1c.

Fifth Variation of First Embodiment

A fifth variation of the first embodiment will be described with reference to FIG. 6 and FIGS. 8A through 8J. FIGS. 8A through 8J are enlarged plan views of the bent portion 2b of the guard ring 2 illustrated in FIG. 6. Although the bent portion 2b in FIG. 6 is indicated at the upper left corner of the guard ring 2, the lower left corner, the lower right corner portion, and the upper right corner may also have the same configuration.

Figure 8A:
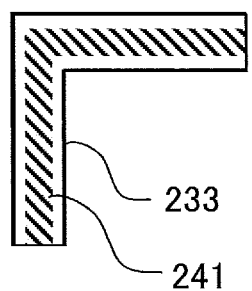
FIG. 8A is a drawing illustrating a fifth variation of the first embodiment.

In the example illustrated in FIG. 8A, the interlayer connection via 241 and the interconnect 233 may be bent at the bent portion 2b such that the inside angle is 90 degrees in a plan view.

Figure 8B:
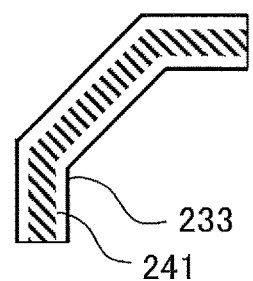
FIG. 8B is a drawing illustrating the fifth variation of the first embodiment.

In the example illustrated in FIG. 8B, the interlayer connection via 241 and the interconnect 233 may be bent multiple times at the bent portion 2b such that each inside angle is greater than 90 degrees in a plan view. In the example illustrated in FIG. 8B, the interlayer connection via 241 and the interconnect 233 are bent twice such that each inside angle is 135 degrees, and such that the total bending angle at the bent portion 2b is 90 degrees. The number of bends may be three or more. The bending angle is not limited to 135 degrees. In the case of multiple bends, the bending angles may differ from each other. In the example illustrated in FIG. 8B, only one bent portion 2b is illustrated, but two or more may be disposed.

Figure 8C:
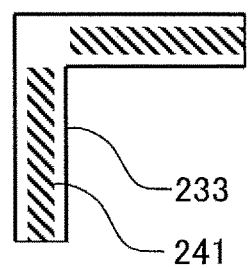
FIG. 8C is a drawing illustrating the fifth variation of the first embodiment.

In the example illustrated in FIG. 8C, the interconnect 233 may be bent at the bent portion 2b such that the inside angle is 90 degrees in a plan view, and the interlayer connection via 241 may be discontinuous at the portion where the interconnect 233 is bent. In the example illustrated in FIG. 8C, only one bent portion 2b is illustrated, but two or more may be disposed.

Figure 8D:
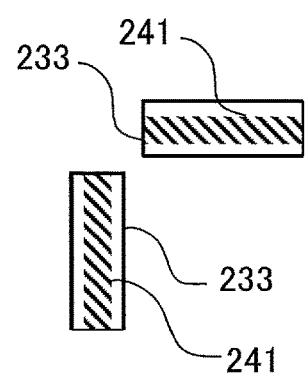
FIG. 8D is a drawing illustrating the fifth variation of the first embodiment.

In the example illustrated in FIG. 8D, the bent portion 2b may be such that the interconnect 233 and the interlayer connection via 241 are both discontinuous. In the example illustrated in FIG. 8D, only one bent portion 2b is illustrated, but two or more may be disposed.

Figure 8E:
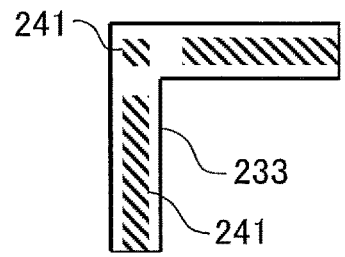
FIG. 8E is a drawing illustrating the fifth variation of the first embodiment.

In the example illustrated in FIG. 8E, the interconnect 233 may be bent at the bent portion 2b such that the inside angle is 90 degrees in a plan view, and a non-groove-shape interlayer connection via 241 may be disposed at the portion where the interconnect 233 is bent. Further, the groove-shape interlayer connection vias 241 may be disposed at spaced intervals from the non-groove-shape interlayer connection via 241. In the example illustrated in FIG. 8E, only one bent portion 2b is illustrated, but two or more may be disposed.

Figure 8F:
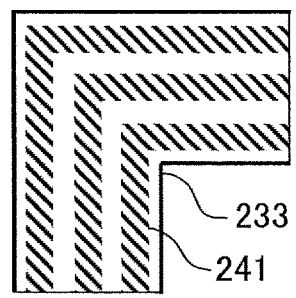
FIG. 8F is a drawing illustrating the fifth variation of the first embodiment.
Figure 8G:
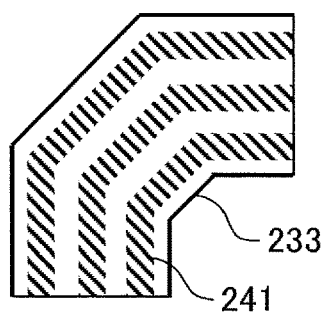
FIG. 8G is a drawing illustrating the fifth variation of the first embodiment.

In the example illustrated in FIG. 8F, three interlayer connection vias 241 and one interconnect 233 overlapping the three interlayer connection vias 244 may be bent at the bent portion 2b such that each inside angle is 90 degrees in a plan view. It may be noted that the number of interlayer connection vias 241 is not limited to three, and may alternatively be two or greater than or equal to four.

In the example illustrated in FIG. 8F, three interlayer connection vias 241 and one interconnect 233 overlapping the three interlayer connection vias 244 may be bent multiple times at the bent portion 2b such that each inside angle is greater than 90 degrees in a plan view. In the example illustrated in FIG. 8G, the interlayer connection vias 241 and the interconnect 233 are bent twice such that each inside angle is 135 degrees, and such that the total bending angle at the bent portion 2b is 90 degrees. The number of bends may be three or more. The bending angle is not limited to 135 degrees. In the case of multiple bends, the bending angles may differ from each other. It may be noted that the number of interlayer connection vias 241 is not limited to three, and may alternatively be two or greater than or equal to four, for example.

Figure 8H:
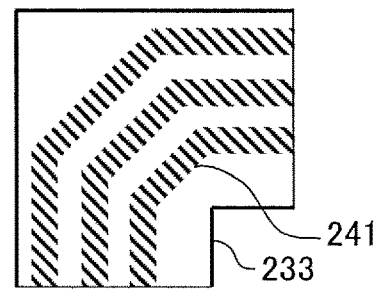
FIG. 8H is a drawing illustrating the fifth variation of the first embodiment.

In the example illustrated in FIG. 8H, three interlayer connection vias 241 may be bent multiple times at the bent portion 2b such that each inside angle is greater than 90 degrees in a plan view, and such that the interconnect 233 overlapping the three interlayer connection vias 241 is bent once such that the inside angle is 90 degrees. In the example illustrated in FIG. 8H, the interlayer connection vias 241 are bent twice such that each inner angle is 135 degrees, and such that the total bending angle at the bent portion 2b is 90 degrees. The number of bends of the interlayer connection vias 241 may be three or more. The bending angle of the interlayer connection vias 241 is not limited to 135 degrees. In the case of the interlayer connection vias 241 being bent multiple times, the bending angles may differ from each other. It may be noted that the number of interlayer connection vias 241 is not limited to three, and may alternatively be two or greater than or equal to 4, for example.

Figure 8I:
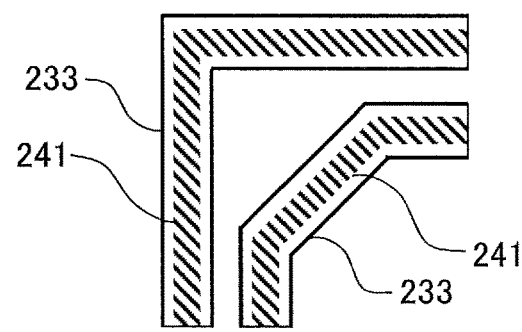
FIG. 8I is a drawing illustrating the fifth variation of the first embodiment.

In the example illustrated in FIG. 8I, at the bent portion 2b, an interconnect 233 and an interlayer connection via 241 situated at an outer position are bent such that the inside angle is 90 degrees in a plan view, and an interconnect 233 and an interlayer connection via 241 situated at an inner position are bent multiple times such that each inside angle is greater than 90 degrees in a plan view. The interconnect 233 and the interlayer connection via 241 situated at the inner position are bent twice such that each inside angle is 135 degrees, and such that the total bending angle at the bent portion 2b is 90 degrees. Alternatively, the number of bends may be three or more, and the bending angle may be a different angle. The noted inner set of interconnect 233 and interlayer connection via 241 may instead be positioned at an outer position, and the noted outer set of interconnect 233 and interlayer connection via 241 may instead be positioned at an inner position. Further, a plurality of interconnects 233 and a plurality of interlayer connection vias 241 may be provided in place of either one or both of the noted inner set of interconnect 233 and interlayer connection via 241 and the noted outer set of interconnect 233 and interlayer connection via 241.

Figure 8J:
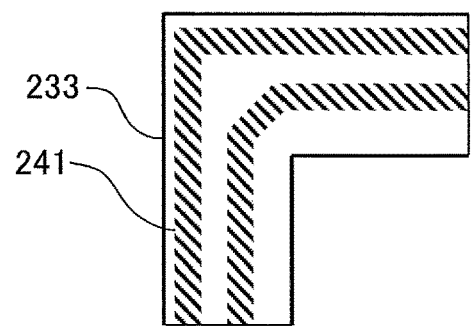
FIG. 8J is a drawing illustrating the fifth variation of the first embodiment.

In the example illustrated in FIG. 8J, at the bent portion 2b, an interlayer connection via 241 situated at an outer position may be bent such that the inside angle is 90 degrees in a plan view, and an interlayer connection via 241 situated at an outer side is bent multiple times at an angle greater than 90 degrees in a plan view. The bent portion 2b has an interconnect 233 that overlaps the inner and outer interlayer connection vias 241 and that is bent such that the inside angle is 90 degrees in a plan view. The inner interlayer connection via 241 is bent twice such that each inside angle is 135 degrees and such that the total bending angle at the bent portion 2b is 90 degrees. Alternatively, the number of bends may be three or more, and the bending angles may differ from each other. The inner interlayer connection via 241 may be positioned at an outer position, and the outer interlayer connection via 241 may be positioned at an inner position. A plurality of interlayer connection vias 241 may be provided in place of either one or both of the inner interlayer connection via 241 and the outer interlayer connection via 241.

Although not illustrated in FIGS. 8A through 8J, the interconnect 231 disposed beneath the interlayer connection via 241 in each modification may have the same arrangement as the interconnect 233, or a different arrangement, in a plan view.

Further, the modifications illustrated in FIGS. 8A through 8J may be combined with each other.

For example, the plurality of interlayer connection vias 241 arranged as illustrated in FIGS. 8F-8J may be arranged discontinuously as in the configurations illustrated in FIGS. 8C and 8E. Further, the bent portions 2b situated in the proximity of the four respective corners of the semiconductor device 1 may have the same modification applied thereto among the modifications illustrated FIGS. 8A through 8J, or may have respective, different modifications applied thereto.

Moreover, one or more combinations of the present modifications may be applied to the guard rings 2 of other embodiments (i.e., the second to fifth embodiments which will be described later). A moisture-resistant ring 3 of the fifth embodiment may also be one to which one or more combinations of the fifth variations is applied to.

In the case in which the modifications illustrated in FIGS. 8A through 8J are applied to a bent portion of the guard ring 2 different from the upper-left bent portion 2b, each is rotated in a plan view for placement.

Sixth Variation of First Embodiment

A sixth variation of the first embodiment will be described with reference to FIGS. 9A through 9D. FIGS. 9A through 9D illustrate a cross-sectional structure of the guard ring 2.

Figure 9A:
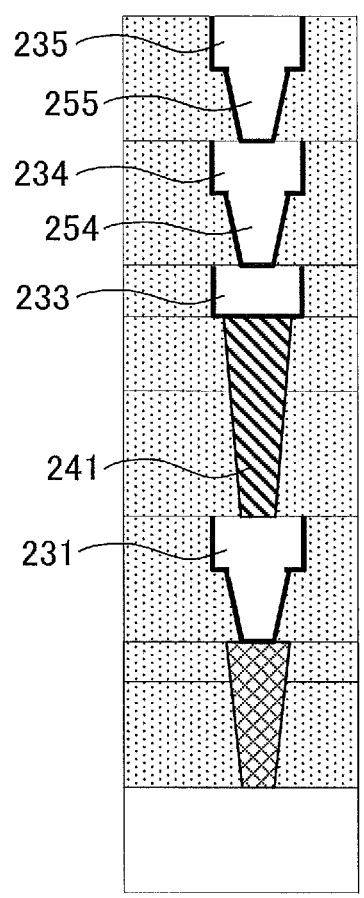
FIG. 9A is a drawing illustrating a sixth variation of the first embodiment.

As illustrated in FIG. 9A, the guard ring 2 may have only one interlayer connection via (i.e., only the interlayer connection via 241 in this example). It should be noted that one interlayer connection via may be formed in a different layer than the interlayer connection via 241.

Figure 9B:
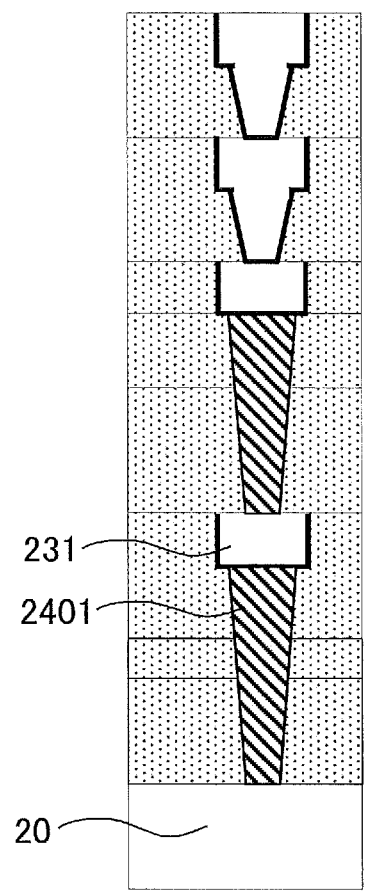
FIG. 9B is a drawing illustrating the sixth variation of the first embodiment.

As illustrated in FIG. 9B, the guard ring 2 may include an interlayer connection via 2401 that connects the substrate 20 and the interconnect 231 of the M1 layer, without being connected to the contact via 250. The interlayer connection via connected to the substrate 20 may alternatively be connected to a higher-layer interconnect situated above the interconnect 231 of the M1 layer, and may be connected to neither the contact via 250 nor the interconnects of one or more intervening layers situated between the substrate 20 and such a higher-layer interconnect.

Figure 9C:
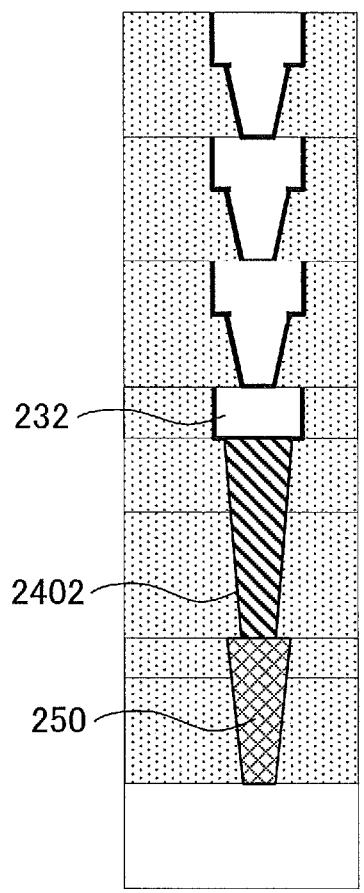
FIG. 9C is a drawing illustrating the sixth variation of the first embodiment.

As illustrated in FIG. 9C, the guard ring 2 may include an interlayer connection via 2402 that connects the contact via 250 and the interconnect 232 of the M2 layer, without being connected to the interconnect 231 of the M1 layer. The interlayer connection via connected to the contact via 250 may alternately be connected to a higher-layer interconnect situated above the interconnect 231 of the M2 layer, and may not be connected to the interconnects of one or more intervening layers situated between the contact via 250 and such a higher-layer interconnect.

Figure 9D:
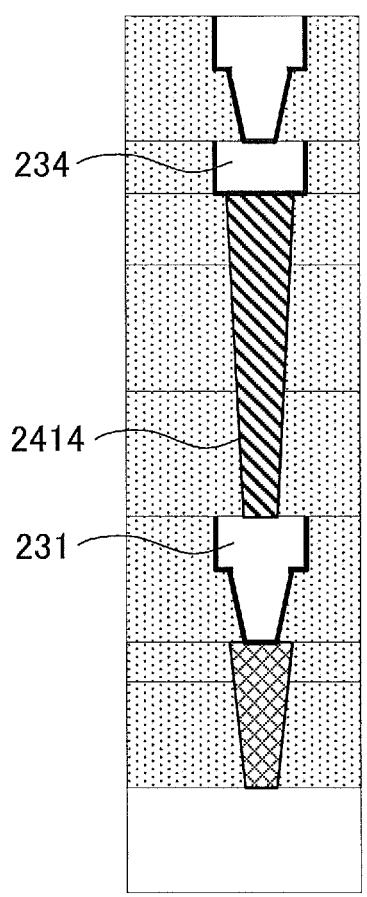
FIG. 9D is a drawing illustrating the sixth variation of the first embodiment.

As illustrated in FIG. 9D, the guard ring 2 may have an interlayer connection via 2414 that connects the interconnect 231 of the layer M1 and the interconnect 234 of the layer M4 located three layers above the M1 layer and that is not connected to the interconnect 232 of the M2 layer and the interconnect 233 of the layer M3. With this configuration, the number of interfaces between interconnects and interlayer insulating films situated thereon decreases, which serves to reduce the likelihood of crack propagation. The interlayer connection via may connect the interconnect layer of a lower layer and the interconnect of a layer that is situated four or more layers above the noted interconnect layer of the lower layer. Moreover, the interlayer connection via of this modification may be formed in other interconnect layers.

Second Embodiment

A second embodiment will be described with reference to FIGS. 10A and 10B. In this embodiment, as in the first embodiment, the guard ring 2 is disposed around and encloses the circuit region 1*a* in a plan view.

Figure 10A:
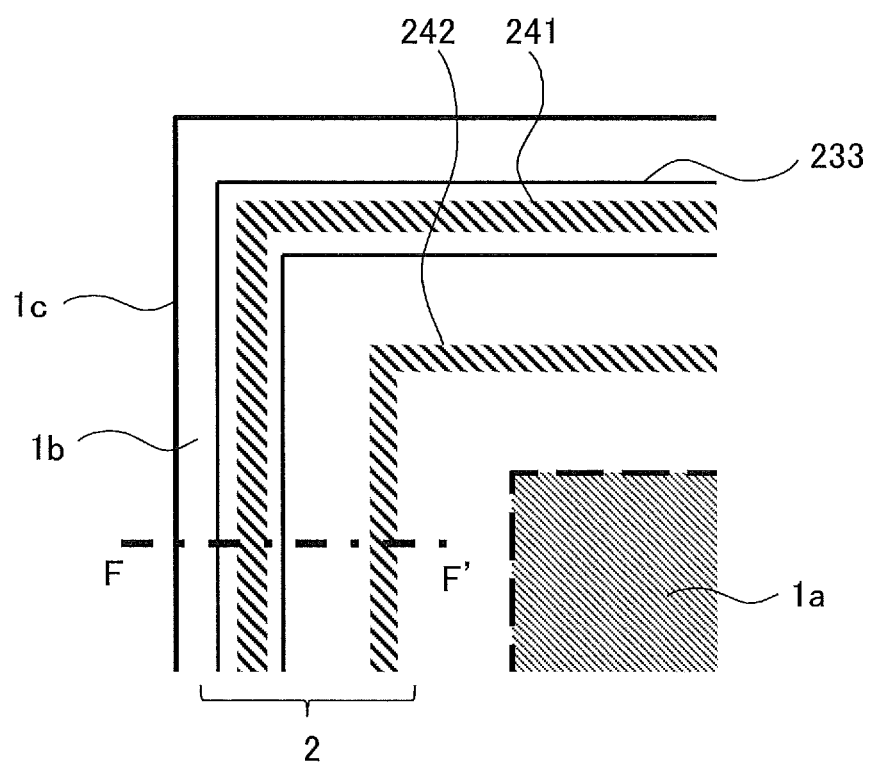
FIG. 10A is a drawing illustrating a second embodiment.
Figure 10B:
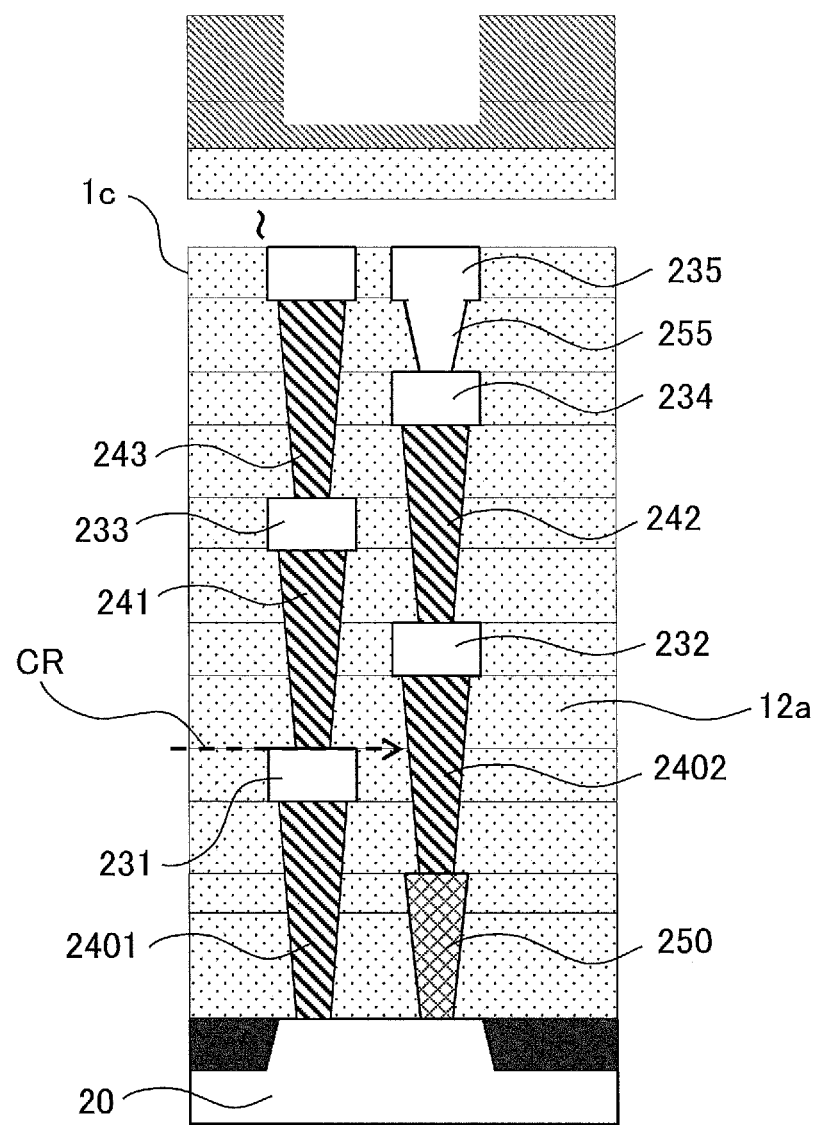
FIG. 10B is a drawing illustrating the second embodiment.

FIG. 10A is a plan view of a portion of the second embodiment corresponding to the portion (as enclosed in the dotted line frame) near the upper left corner of the semiconductor device 1 in FIG. 1A. In FIG. 10A, the configuration of interconnects and the like disposed in the circuit region 1*a* is omitted from the illustration. FIG. 10B is a cross-sectional view taken along the line F-F' illustrated in FIG. 10A. As illustrated in FIG. 10B, the guard ring 2 includes at an outer position (i.e., close to the perimeter edge 1*c*) an interlayer connection via 2401 connecting the substrate 20 and the interconnects 231, an interlayer connection via 241 connecting the interconnect 231 and the interconnect 233, and an interlayer connection via 243 connecting the interconnect 233 and the interconnect 235. The guard ring 2 also includes, at an inner position (i.e., far away from the perimeter edge 1*c*), an interlayer connection via 2402 connecting the contact via 250 and the interconnect 232 and an interlayer connection via 242 connecting the interconnect 232 and the interconnect 234. In this configuration, the interlayer connection via at the inner position and the interlayer connection via at the outer position are staggered in a cross-sectional direction as illustrated in FIG. 10B. In this arrangement, a crack CR may propagate along the interface between the outer interconnect 231 and the interlayer insulating film 12*a* situated thereon. However, there is no interface between the interconnect 231 and the interlayer insulating film 12*a* at an inner position relative thereto, and the interlayer connection via 2402 is present. The propagation of the crack CR is thus stopped at the interlayer connection via 2402. It is thus possible to further reduce the likelihood of crack propagation reaching the circuit region 1*a*.

Alternatively, the guard ring 2 may be such that the noted inner set of interlayer connection via and interconnect is instead disposed at an outer position, and the noted outer set of interlayer connection via and interconnect is instead disposed at an inner position. In FIG. 10B, the guard ring 2 includes the interlayer connection vias 2401, 241, and 243 at the outer position. Alternatively, an interlayer connection via may be disposed only at a selected portion, and, also, another interlayer connection via may be disposed on the interconnect 235. Similarly, only one of the inner interlayer connection vias 2402 and 242 may be provided, and, also, another interlayer connection via may be disposed on the interconnect 234. The configuration of the guard ring 2 according to the second embodiment may be combined with a guard ring 2 of another embodiment.

Third Embodiment

A third embodiment will be described with reference to FIGS. 11A and 11B. In this embodiment, as in the first embodiment, the guard ring 2 is disposed around and encloses the circuit region 1*a* in a plan view.

Figure 11A:
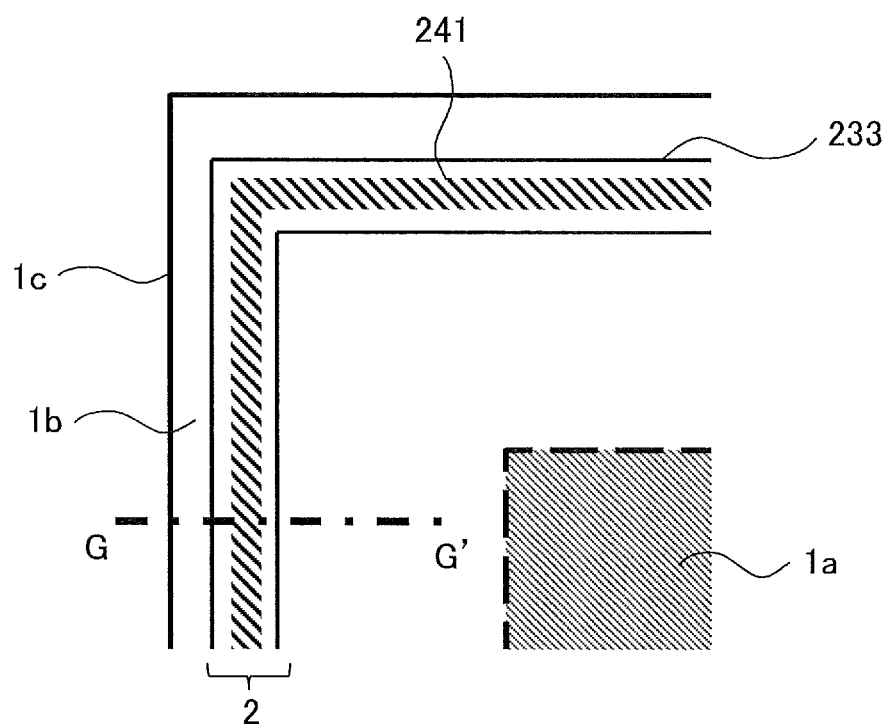
FIG. 11A is a drawing illustrating a third embodiment.
Figure 11B:
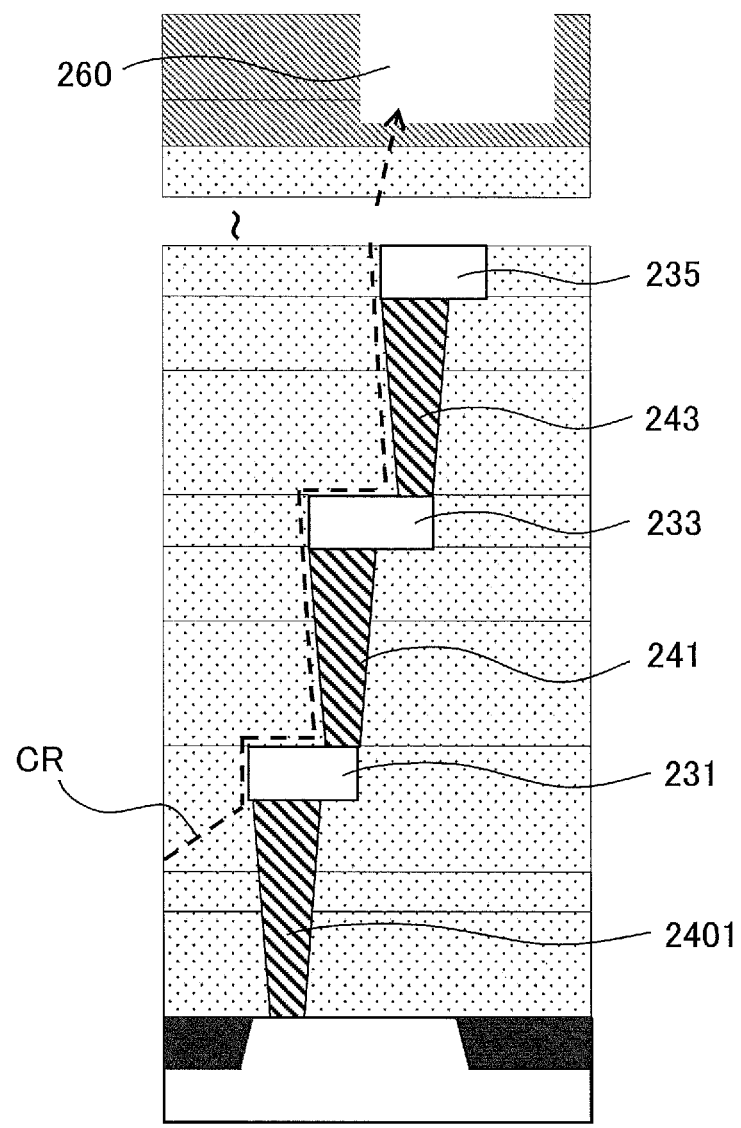
FIG. 11B is a drawing illustrating the third embodiment.

FIG. 11A is a plan view illustrating a portion of the third embodiment corresponding to the portion (as enclosed in the dotted line frame) near the upper left corner of the semiconductor device 1 illustrated in FIG. 1A. In FIG. 11A, the configuration of interconnects and the like disposed in the circuit region 1*a* is omitted from the illustration. FIG. 11B is a cross-sectional view taken along the line G-G' illustrated in FIG. 11A. As illustrated in FIG. 11B, the guard ring 2 of the present embodiment is such that interlayer connection vias (i.e., interlayer connection vias 2401, 241, and 243 in this example) and interconnects (i.e., interconnects 231, 233, and 235 in this example) are arranged in a staircase shape. Such an arrangement allows the crack CR to propagate along the side surfaces of the interlayer connection vias and the interconnects and to be guided to, and terminated at, the opening 260. This configuration reduces the likelihood of crack propagation reaching the circuit region 1*a*.

The configuration of the guard ring 2 according to the present embodiment may be combined with a guard ring 2 of another embodiment or variation.

Fourth Embodiment

A fourth embodiment will be described with reference to FIGS. 12A and 12B. In this embodiment, as in the first embodiment, the guard ring 2 is disposed around and encloses the circuit region 1*a* in a plan view.

Figure 12A:
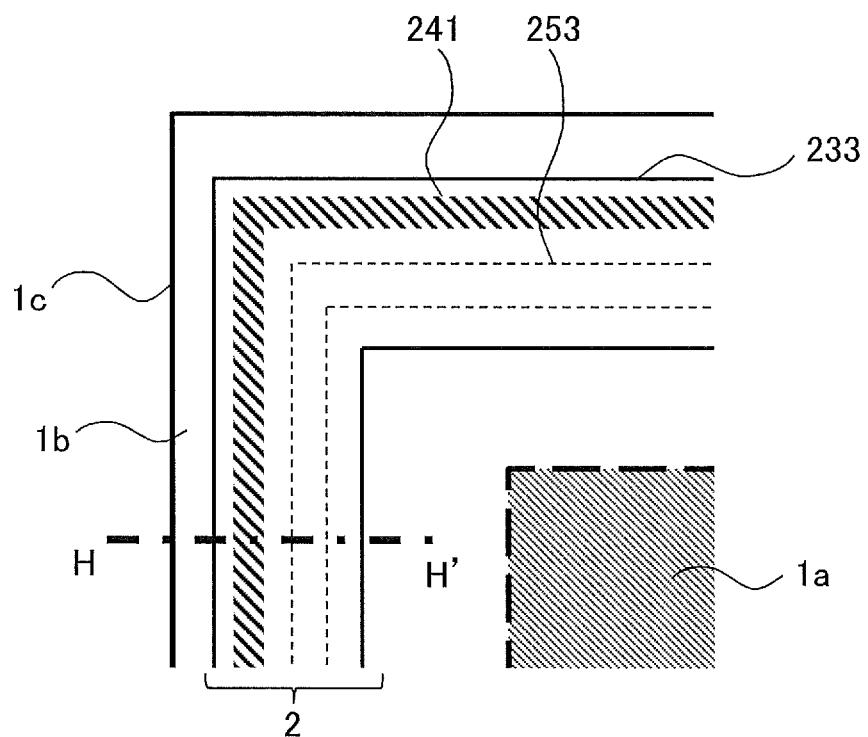
FIG. 12A is a drawing illustrating a fourth embodiment.

FIG. 12A is a plan view of a portion of the fourth embodiment corresponding to the portion (as enclosed in the dotted line frame) near the upper left corner of the semiconductor device 1 in FIG. 1A. In FIG. 12A, the configuration of interconnects and the like disposed in the circuit region 1*a* is omitted from the illustration. FIG. 12B is a cross-sectional view taken along the line H-H' illustrated in FIG. 12A.

Figure 12B:
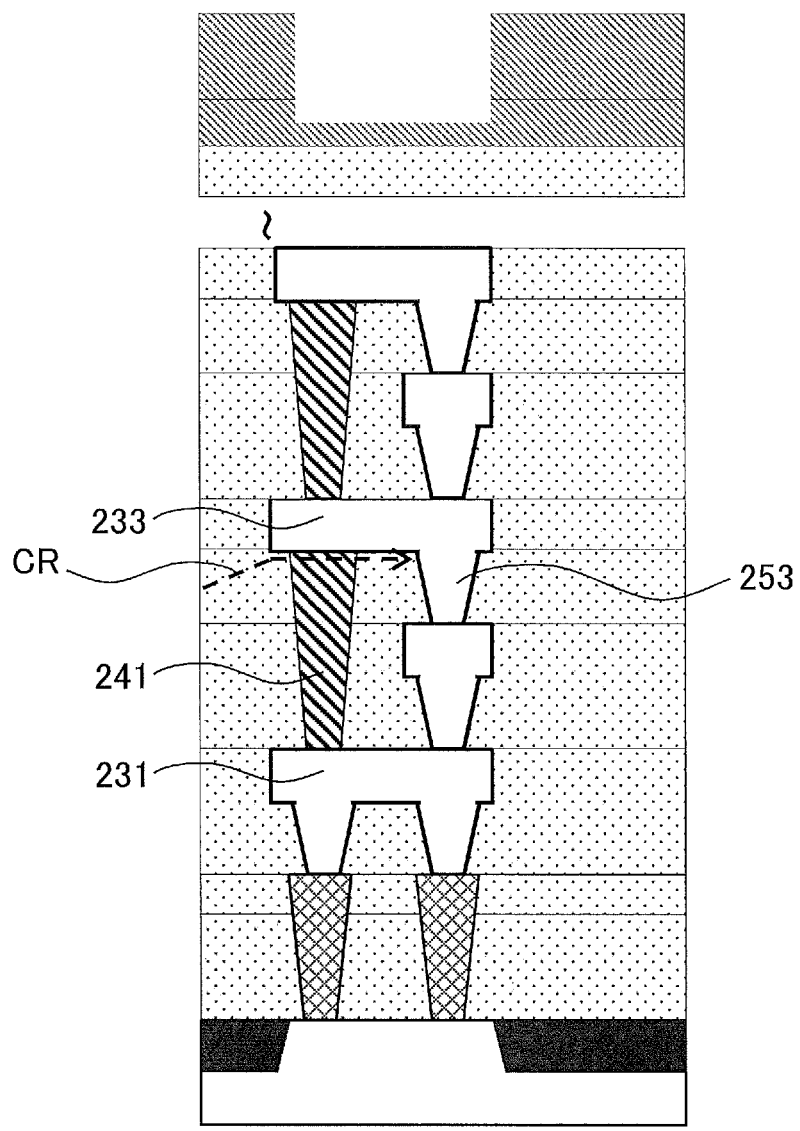
FIG. 12B is a drawing illustrating the fourth embodiment.

As illustrated in FIGS. 12A and 12B, the guard ring 2 of the present embodiment is such that the interlayer connection via 241 arranged in a groove shape and the via 253 arranged in a groove shape are connected to the interconnect 233 situated immediately thereabove. The interconnect 233 and via 253 have a dual damascene structure formed as one seamless piece.

In this configuration, a crack CR may propagate along the interface between the interconnect 233 and the interlayer connection via 241 situated therebeneath. However, the dual damascene structure of the interconnect 233 and the via 253 situated at an inner position relative thereto ensures that there is no interface that would allow crack propagation.

Accordingly, even when the interlayer connection via fail to stop crack propagation, the inner configuration of the guard ring 2 properly reduces the likelihood of crack propagation.

The configuration of the guard ring 2 according to the present embodiment may be combined with a guard ring 2 of another embodiment or variation.

Fifth Embodiment

A fifth embodiment will be described with reference to FIGS. 13A through 13C.

Figure 13A:
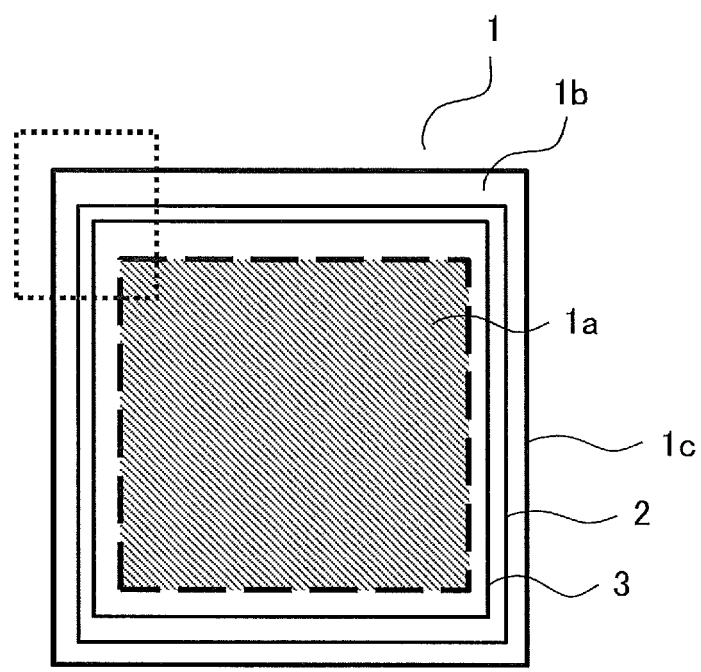
FIG. 13A is a drawing illustrating a fifth embodiment.

As illustrated in FIG. 13A, the guard ring 2 in this embodiment is arranged around and encloses the circuit region 1a in a plan view as in the first embodiment. In this embodiment, a moisture-resistant ring 3 enclosing the circuit region 1a in a plan view is disposed between the guard ring 2 and the circuit region 1a, for example. FIG. 13B is a plan view of the upper left corner (i.e., the portion enclosed in the dotted line frame) of the semiconductor device 1 illustrated in FIG. 13A. In FIG. 13B, the configuration of interconnects and the like disposed in the circuit region 1a is omitted from the illustration. FIG. 13B illustrates interconnects 233 and 333 in the M3 layer, interlayer connection vias 241 and 341 situated therebeneath, and the like. Other interconnect layers may have the same configuration. The configuration of interconnects and the like disposed in the circuit region 1a is omitted from the illustration. FIG. 13C is a cross-sectional view taken along the line I-I' illustrated in FIG. 13B.

Figure 13B:
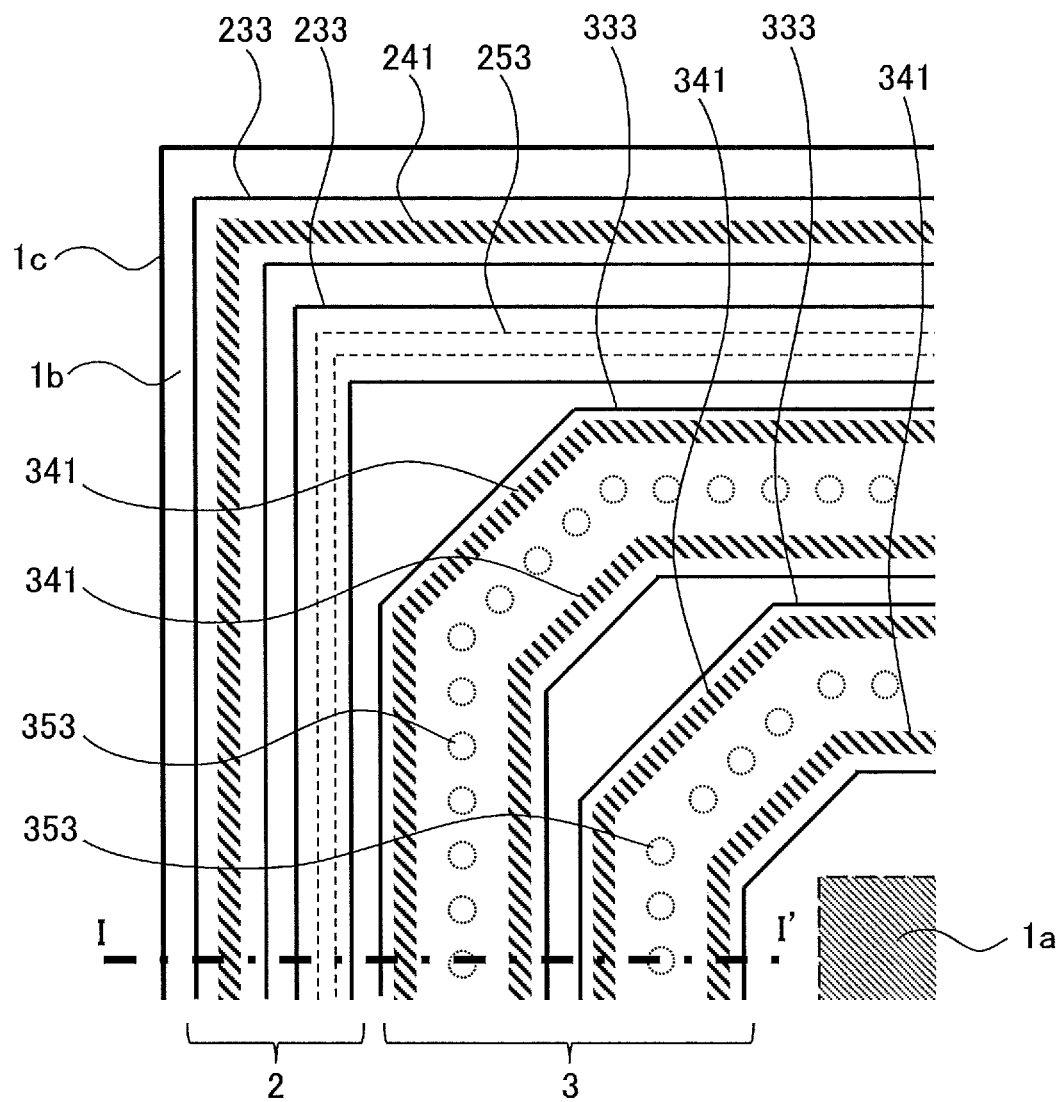
FIG. 13B is a drawing illustrating the fifth embodiment.
Figure 13C:
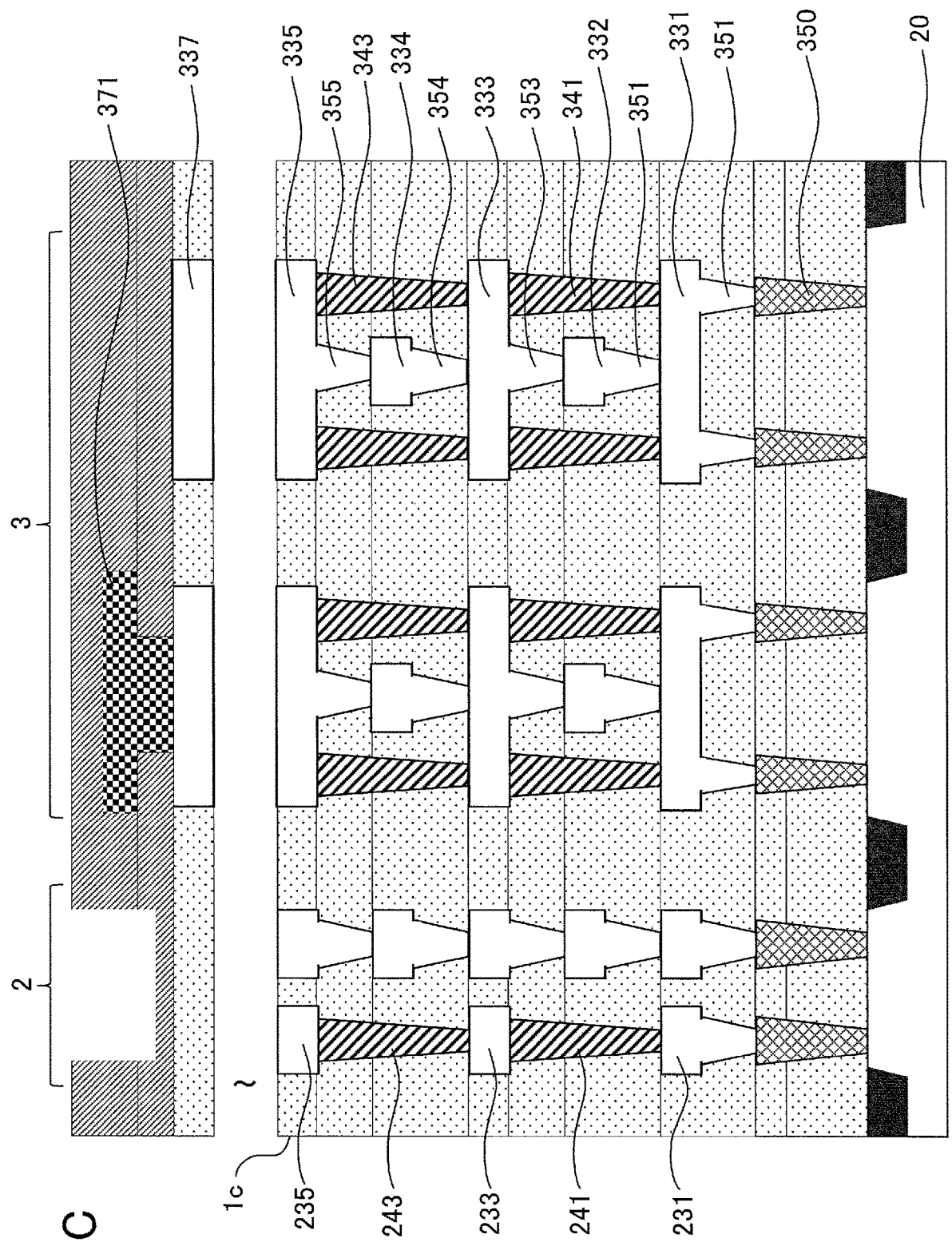
FIG. 13C is a drawing illustrating the fifth embodiment.

As illustrated in FIGS. 13B and 13C, the guard ring 2 and the moisture-resistant ring 3 are disposed in the peripheral region 1b. The moisture-resistant ring 3 includes the interlayer connection vias 341 extending in a groove shape and the interconnects 333. Two interconnects 333 are disposed, and overlay the two respective interlayer connection vias 341 in a plan view. Further, pore-shape vias 353 are arranged between the two interlayer connection vias in a plan view. Each of the interconnects 333 and the two interlayer connection vias 241 is bent twice such that each inside angle is an angle (e.g., 135 degrees) greater than 90 degrees. The vias 353 between the two interlayer connection vias 241 are disposed even between the two bends.

In the present embodiment as described above, the moisture-resistant ring 3 having interlayer connection vias is disposed inside the guard ring 2. With this configuration, the presence of interlayer connection vias prevents moisture from reaching the circuit region 1a through interfaces between interlayer insulating films or interfaces between interlayer insulating films and interconnects. It is thus possible to reduce the likelihood of reliability degradation caused by changes in electrical properties or corrosion resulting from the infiltration of moisture into the circuit region 1a.

The pore-shape vias 253 of the moisture-resistant ring 3 may instead be arranged in a groove shape in a plan view, and, alternatively, the formation of vias 253 may be omitted. In FIG. 13B, two groups each comprised of an interconnect 333 and interlayer connection vias 241 connected to the interconnect 333 are disposed in the moisture-resistant ring 3. Alternatively, the number of such groups may be one, or may be three or more. The number of interlayer connection vias 341 connected to each interconnect 333 may alternatively be one, or greater than or equal to three. As illustrated in FIG. 13C, a pad pattern 371 may be formed on the moisture-resistant ring 3. The pad pattern 371 may be arranged such as to partially overlap the moisture-resistant ring 3 in a plan view, or may be arranged such as to enclose the circuit region 1a in a plan view. Further, the moisture-resistant ring 3 disposed at the inner position may instead be disposed at an outer position, and the guard ring 2 disposed at the outer position may instead be disposed at an inner position. Moreover, the provision of the guard ring 2 may be omitted while the moisture-resistant ring 3 is provided.

The interconnects and interlayer connection vias in the moisture-resistant ring 3 may have configurations substantially the same as the configurations of the embodiments and variations of the guard ring 2 or configurations made by a combination thereof.

The present invention is not limited to the specific configurations of the embodiments and variations described heretofore. For example, interconnects, vias, contact vias, and interlayer connection vias not illustrated in the disclosed plan views may be arranged in a groove shape to enclose the circuit region 1a, or may have configurations as defined in the embodiments or variations. The configurations of the embodiments and variations may be combined with each other.

What is claimed is:

1. A semiconductor device, comprising:
   a substrate having a circuit region and a peripheral region disposed around and enclosing the circuit region in a plan view;
   a first interconnect layer formed on the substrate;
   a second interconnect layer formed on the first interconnect layer;
   a third interconnect layer formed on the second interconnect layer; and
   a guard ring formed in the peripheral region,
   wherein the guard ring includes:
   a first interconnect formed in the first interconnect layer, and disposed around and enclosing the circuit region in a plan view;
   a second interconnect formed in the third interconnect layer, and disposed around and enclosing the circuit region in a plan view; and
   a first via including a metal structure that is directly connected to both the first interconnect and the second interconnect, and is disposed in a groove shape along, a perimeter edge of the substrate in a plan view, the metal structure being without an interface at a bounda between the second interconnect layer and the third interconnect layer.

2. The semiconductor device as claimed in claim 1, wherein the substrate is a rectangle having four corners, and the guard ring has bent portions at the four corners, respectively, the first via being bent at 90 degrees in a plan view in the bent portions.

3. The semiconductor device as claimed in claim 1, wherein the substrate is a rectangle having four corners, and the guard ring has bent portions at the four corners, respectively, the first via being bent multiple times at an angle greater than 90 degrees in a plan view so as to be bent at 90 degrees in total in a plan view in each bent portion.

4. The semiconductor device as claimed in claim 1, wherein the guard ring includes a third interconnect formed in the first interconnect layer and a fourth interconnect formed in the third interconnect layer, the third interconnect disposed around and enclosing the circuit region in a plan view, the fourth interconnect disposed around and enclosing the circuit region in a plan view.

5. The semiconductor device as claimed in claim 4, wherein the guard ring includes a second via that is connected to the third interconnect and to the fourth interconnect and that is disposed in a groove shape along the perimeter edge of the substrate in a plan view.

6. The semiconductor device as claimed in claim 4, wherein the guard ring includes:
   a fifth interconnect formed in the second interconnect layer;
   a third via connected to the third interconnect and to the fifth interconnect, and disposed in a groove shape along the perimeter edge of the substrate in a plan view; and
   a fourth via connected to the fifth interconnect and to the fourth interconnect, and disposed in a groove shape along the perimeter edge of the substrate in a plan view.

7. The semiconductor device as claimed in claim 4, wherein the third interconnect and the fourth interconnect are situated, in a plan view, between the circuit region and each of the first interconnect, the second interconnect, and the first via.

8. The semiconductor device as claimed in claim 4, wherein the third interconnect and the fourth interconnect are situated, in a plan view, between the perimeter edge of the substrate and each of the first interconnect, the second interconnect, and the first via.

9. The semiconductor device as claimed in claim 1, wherein the guard ring includes a second via that is connected to the first interconnect and to the second interconnect and that is positioned in a groove shape along the perimeter edge of the substrate in a plan view.

10. The semiconductor device as claimed in claim 1, further comprising a fourth interconnect layer formed on the third interconnect layer,
    wherein the guard ring includes:
    a third interconnect formed in the second interconnect layer and enclosing the circuit region in a plan view;
    a fourth interconnect formed in the fourth interconnect layer and enclosing the circuit region in a plan view; and
    a second via connected to the third interconnect and to the fourth interconnect and disposed in a groove shape along the perimeter edge of the substrate.

11. The semiconductor device as claimed in claim 1, wherein the first via is disposed around and encloses the circuit region in a plan view.

12. The semiconductor device as claimed in claim 1, wherein the first via is discontinuously disposed in a plan view.

\* \* \* \* \*